(12) United States Patent
Sakamoto

(10) Patent No.: US 10,541,385 B2
(45) Date of Patent: Jan. 21, 2020

(54) DISPLAY DEVICE AND METHOD OF MANUFACTURING A DISPLAY DEVICE

(71) Applicant: Japan Display Inc., Minato-ku (JP)

(72) Inventor: Shigeru Sakamoto, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/953,528

(22) Filed: Apr. 16, 2018

(65) Prior Publication Data

US 2018/0301665 A1  Oct. 18, 2018

(30) Foreign Application Priority Data

Apr. 17, 2017  (JP) ................................. 2017-081348

(51) Int. Cl.
*H01L 51/56* (2006.01)
*H01L 51/52* (2006.01)
*H01L 27/32* (2006.01)

(52) U.S. Cl.
CPC ...... *H01L 51/5275* (2013.01); *H01L 27/3244* (2013.01); *H01L 51/56* (2013.01); *H01L 27/3246* (2013.01); *H01L 51/5253* (2013.01); *H01L 51/5271* (2013.01)

(58) Field of Classification Search
CPC . H01L 51/5245; H01L 51/56; H01L 27/3244; H01L 51/50; H01L 51/5275

USPC ............ 257/40, 72, 79; 438/82, 99, 48, 128
See application file for complete search history.

(56) References Cited

U.S. PATENT DOCUMENTS

2011/0121271 A1\* 5/2011 Jeon et al. .......... H01L 51/5253
257/40
2013/0256648 A1  10/2013 Nakatani

FOREIGN PATENT DOCUMENTS

| JP | 2011-65800 | 3/2011 |
| JP | 4990425 | 8/2012 |

\* cited by examiner

*Primary Examiner* — Thinh T Nguyen
(74) *Attorney, Agent, or Firm* — Oblon, McClelland, Maier & Neustadt, L.L.P.

(57) ABSTRACT

A display device according to an embodiment of the present invention includes: a substrate; an organic light-emitting diode provided for each pixel on the substrate; an insulating layer that is formed along a boundary of the pixel and has an opening portion in a light-emitting region of the pixel; a first refractive index layer; and a second refractive index layer. The first refractive index layer is disposed on the insulating layer and the organic light-emitting diode, is made of a material having a first refractive index, and has a first recessed portion overlapping with a formation region of the insulating layer in plan view. The second refractive index layer is disposed inside the first recessed portion and is made of a material having a second refractive index lower than the first refractive index.

9 Claims, 13 Drawing Sheets

DISPLAY DEVICE AND METHOD OF MANUFACTURING A DISPLAY DEVICE

CROSS-REFERENCE TO RELATED APPLICATION

The present application claims priority from Japanese Application JP 2017-081348 filed on Apr. 17, 2017, the content of which is hereby incorporated by reference into this application.

BACKGROUND OF THE INVENTION

1. Field of the Invention

The present invention relates to a display device and a method of manufacturing a display device.

2. Description of the Related Art

A flat panel display such as an organic electroluminescence (EL) display device has a display panel on which a thin film transistor (TFT), an organic light-emitting diode (OLED), or the like is formed on a substrate.

JP2011-65800A discloses a configuration having a plurality of organic light-emitting diodes disposed above an underlying structure layer including a substrate, a TFT, an interlayer insulating layer, and the like, and banks disposed between the plurality of organic light-emitting diodes, and further having an inorganic sealing film and a filling layer above the banks.

SUMMARY OF THE INVENTION

However, there is a problem that light extraction efficiency is low in the configuration of the related art described above. That is, in the configuration of the related art described above, the inorganic sealing film has a refractive index higher than a refractive index of the filling layer. Therefore, when light emitted from the organic light-emitting diode in a direction oblique to a light-emitting surface of the diode is incident on the inorganic sealing film formed above the bank, the light is reflected at an interface between the inorganic sealing film and the filling layer, and the light extraction efficiency deteriorates.

One or more embodiments of the present invention are made in view of the problem described above, and a purpose thereof is to improve the light extraction efficiency of the light emitted from the organic light-emitting diode in the direction oblique to the light-emitting surface of the diode.

1. A display device according to an embodiment of the present invention includes: a substrate; an organic light-emitting diode that includes a first electrode, a first organic layer provided on the first electrode, and a second electrode provided on the first organic layer, which are provided for each pixel on the substrate; an insulating layer that is formed along a boundary of the pixel and has an opening portion in a light-emitting region of the pixel; a first refractive index layer; and a second refractive index layer. The first refractive index layer is disposed on the insulating layer and the organic light-emitting diode, is made of a material having a first refractive index, and has a first recessed portion overlapping with a formation region of the insulating layer in plan view. The second refractive index layer is disposed inside the first recessed portion and is made of a material having a second refractive index lower than the first refractive index.

2. In the display device according to the above-mentioned item 1, the first refractive index layer may include a first inorganic insulating layer and a second inorganic insulating layer provided above the first inorganic insulating layer, and a second organic layer may be provided between the first inorganic insulating layer and the second inorganic insulating layer in the light-emitting region.

3. In the display device according to the above-mentioned item 2, the second organic layer may have a second recessed portion in the formation region of the insulating layer, and the second inorganic insulating layer may be provided along an upper surface shape of the second organic layer and have the first recessed portion having a shape conforming to the second recessed portion, and the first inorganic insulating layer and the second inorganic insulating layer may be in contact with each other at the second recessed portion.

4. In the display device according to any one of the above-mentioned items 1 to 3, the insulating layer may have a third recessed portion on the upper surface of the insulating layer, the first refractive index layer may have a shape conforming to an upper surface shape of the insulating layer in the formation region of the insulating layer, and the first recessed portion may overlap with the third recessed portion in plan view.

5. In the display device according to any one of the above-mentioned items 1 to 4, the first recessed portion may include an inner side surface curved toward an opening side of the first recessed portion.

6. In the display device according to any one of the above-mentioned items 1 to 5, the first refractive index layer may include silicon.

7. In the display device according to any one of the above-mentioned items 1 to 6, the second refractive index layer may include anyone of the air, nitrogen gas, and an organic material having transparency as a constituent material.

8. In the display device according to any one of the above-mentioned items 1 to 7, the first recessed portion may be provided so as to surround one light-emitting region or a plurality of the light-emitting regions in plan view.

9. In the display device according to the above-mentioned item 8, the first recessed portion may be formed in a region having a substantially rectangular shape in plan view, and, in the substantially rectangular shape, a length of a long side may be two times or more a length of a short side.

10. A method of manufacturing a display device according to an embodiment of the present invention includes: a step of preparing a substrate; a step of providing an organic light-emitting diode including a first electrode, a first organic layer provided on the first electrode, and a second electrode provided on the first organic layer provided for each pixel on the substrate; a step of forming an insulating layer that is formed along a boundary of the pixel and has an opening portion in a light-emitting region of the pixel; a step of forming a first refractive index layer disposed on the insulating layer and the organic light-emitting diode, made of a material having a first refractive index, and having a first recessed portion overlapping with a formation region of the insulating layer in plan view; and a step of forming a second refractive index layer disposed inside the first recessed portion and made of a material having a second refractive index lower than the first refractive index.

11. In the method of manufacturing a display device according to the above-mentioned item 10, the step of forming a first refractive index layer may include a step of forming a first inorganic insulating layer and a step of forming a second inorganic insulating layer provided above the first inorganic insulating layer, and a step of forming a second organic layer above the first inorganic insulating layer after forming the first inorganic insulating layer and before forming the second inorganic insulating layer.

12. In the method of manufacturing a display device according to the above-mentioned item 11, in the step of forming a second organic layer, a second recessed portion may be formed on the upper surface of the second organic layer in the formation region of the insulating layer, and, in the step of forming a second inorganic insulating layer, the second inorganic insulating layer may be formed along an upper surface shape of the second organic layer by sputtering or vapor deposition, and the first recessed portion having a shape conforming to the second recessed portion may be formed in the second inorganic insulating layer.

13. In the method of manufacturing a display device according to the above-mentioned item 10, a third recessed portion may be formed on the upper surface of the insulating layer after forming the insulating layer, and the first refractive index layer having the first recessed portion having a shape conforming to the third recessed portion may be formed by forming the first inorganic insulating layer above the insulating layer by vapor deposition or sputtering.

DETAILED DESCRIPTION OF THE INVENTION

First Embodiment

Figure 1:
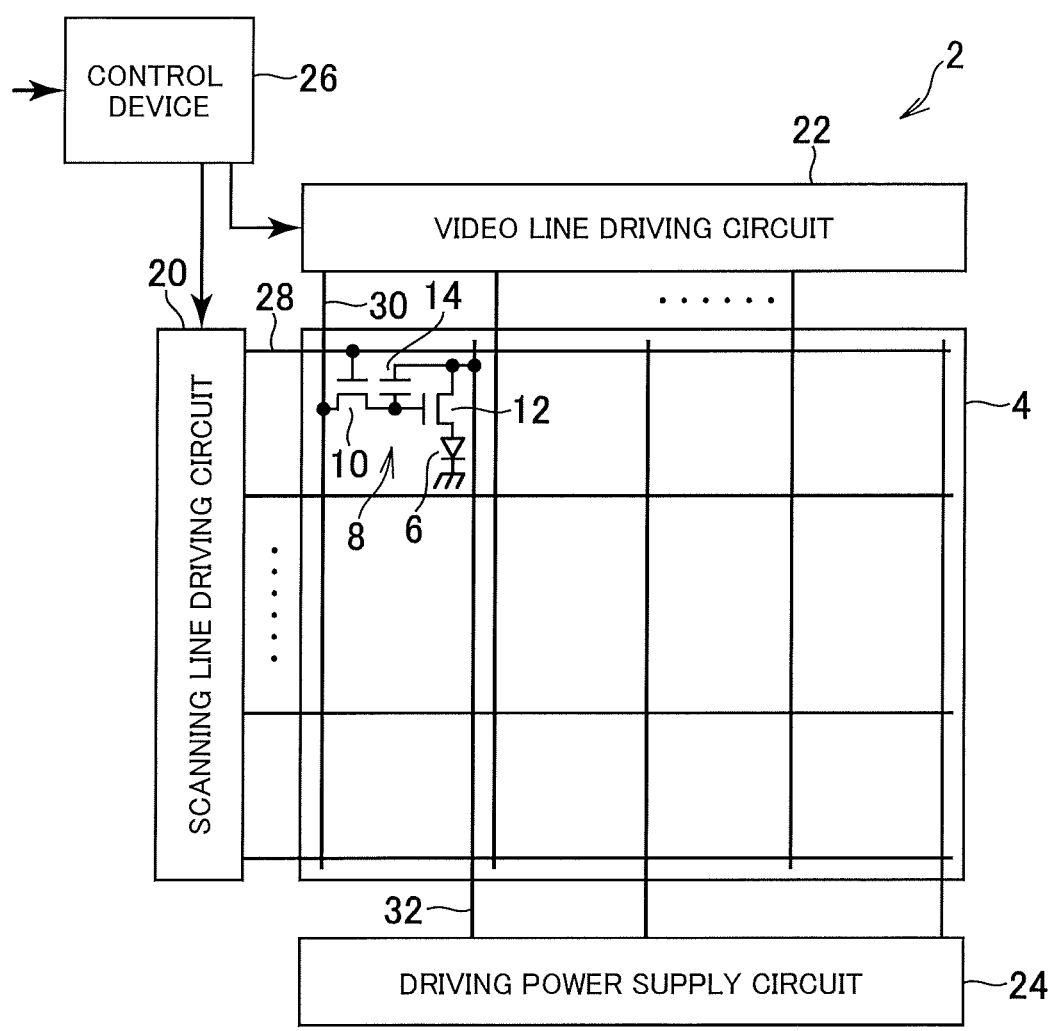
FIG. 1 is a schematic diagram illustrating a general configuration of a display device according to a present embodiment.

Hereinafter, an embodiment of the present invention will be described with reference to drawings.

The present disclosure is merely an example, and an appropriate modification, which can be easily conceived by those skilled in the art, maintaining the gist of the present invention is naturally included in the scope of the present invention. There is a case where the drawing is schematically represented in terms of width, thickness, shape, and the like of each portion compared with an actual form for more clear description. However, the drawing is merely an example and does not limit the interpretation of the present invention. In the specification and each figure, the same element as that described above in a preceding figure may be assigned the same reference numeral and a detailed description thereof may be omitted as appropriate.

when a positional relationship between one component and another component is defined, unless specified otherwise, the words "on" and "under" are not applied only to a situation where the other component is located directly on or directly under the one component, but may also be applied to a situation where still another component is interposed between the one component and the other component.

A display device 2 according to the present embodiment is, for example, an organic electroluminescence display device and is mounted on television, personal computer, mobile terminal, mobile phone, and the like. FIG. 1 is a schematic diagram illustrating a general configuration of a display device 2 according to the embodiment. The display device 2 includes a pixel array portion 4 that displays an image and a driving unit that drives the pixel array portion 4. The display device 2 may have a base material made of glass or the like. The display device 2 may be a flexible display having flexibility and may have a base material made of a resin film having flexibility or the like in the case. The display device 2 has a wiring layer including wiring provided inside or above the base material.

In the pixel array portion 4, organic light-emitting diodes 6 and pixel circuits 8 are arranged in a matrix form corresponding to pixels. The pixel circuit 8 includes a lighting thin film transistor (TFT) 10, a driving TFT 12, a capacitor 14, and the like.

On the other hand, the driving unit includes a scanning line driving circuit 20, a video line driving circuit 22, a driving power supply circuit 24, and a control device 26. The driving unit drives the pixel circuit 8 and controls emission of the organic light-emitting diode 6.

The scanning line driving circuit 20 is connected to a scanning signal line 28 provided for each arrangement (pixel row) in the horizontal direction of the pixels. The scanning line driving circuit 20 sequentially selects the scanning signal line 28 in response to a timing signal input from the control device 26 and applies a voltage for turning on the lighting TFT 10 to a selected scanning signal line 28.

The video line driving circuit 22 is connected to a video signal line 30 provided for each arrangement (pixel column) in the vertical direction of the pixels. The video line driving circuit 22 receives a video signal from the control device 26 and outputs a voltage corresponding to the video signal of a selected pixel row to each video signal line 30 in accordance with the selection of the scanning signal line 28 by the scanning line driving circuit 20. The voltage is written in the capacitor 14 through the lighting TFT 10 in the selected pixel row. The driving TFT 12 supplies a current corresponding to the written voltage to the organic light-emitting diode 6, and thus the organic light-emitting diode 6 of a pixel corresponding to the selected scanning signal line 28 emits light.

The driving power supply circuit 24 is connected to a driving power supply line 32 provided for each pixel column and supplies a current to the organic light-emitting diode 6 through the driving power supply line 32 and the driving TFT 12 of the selected pixel row.

Here, a lower electrode of the organic light-emitting diode 6 is connected to the driving TFT 12. On the other hand, an upper electrode of each organic light-emitting diode 6 is configured of an electrode common to the organic light-emitting diodes 6 of all pixels. In a case where the lower electrode is configured as the anode, high potential is input, and the upper electrode becomes the cathode and low potential is input. In a case where the lower electrode is configured as the cathode, the low potential is input, and the upper electrode becomes the anode and the high potential is input.

Figure 2:
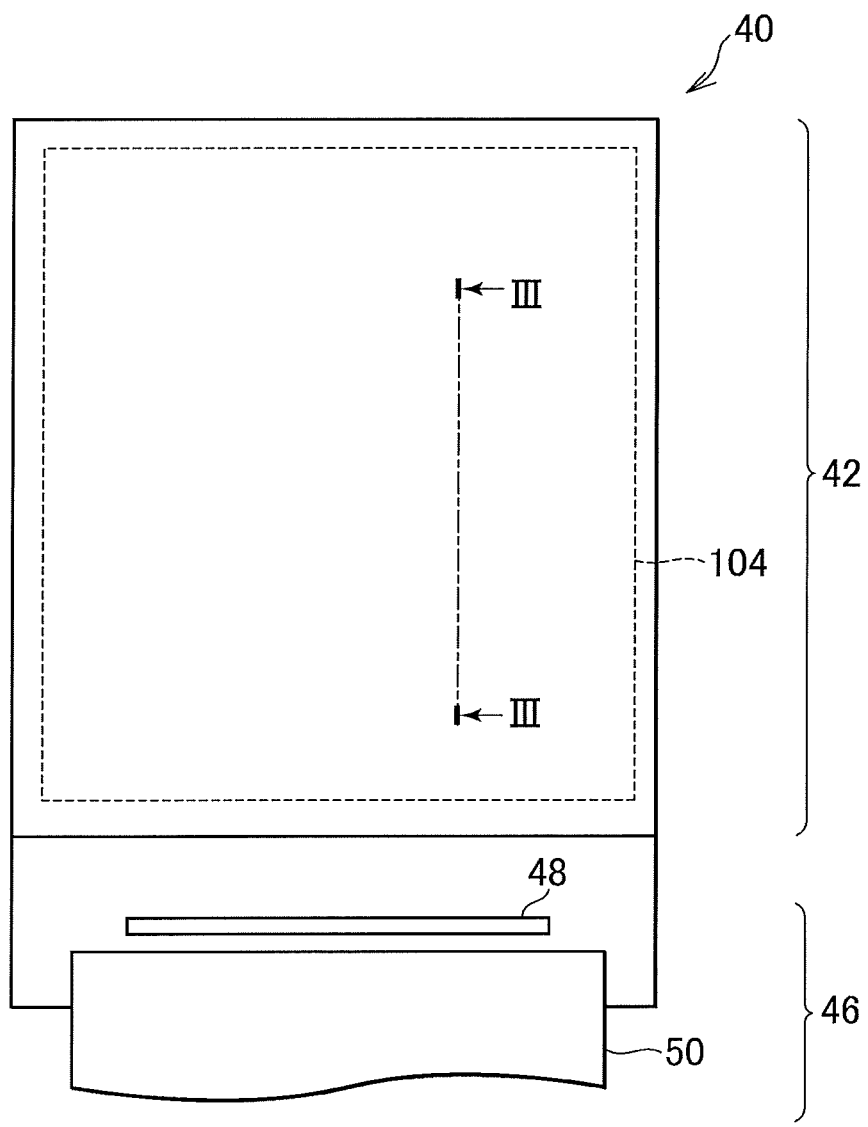
FIG. 2 is a schematic plan view of a display panel in the display device according to the present embodiment.

FIG. 2 is a schematic plan view of a display panel 40 of the display device 2. The pixel array portion 4 illustrated in FIG. 1 is provided in a display region 42 of the display panel 40, and the organic light-emitting diodes 6 are arranged in the pixel array portion 4 as described above.

A driving unit formation region 46 is provided outside the display region 42 in the display panel 40, and wiring connected to the display region 42 is disposed in the driving unit formation region 46. Further, a driver IC 48 configuring the driving unit is mounted in the driving unit formation region 46, or flexible printed circuits (FPC) 50 are connected thereto. The FPC 50 is connected to the scanning line driving circuit 20, the video line driving circuit 22, the driving power supply circuit 24, the control device 26, and the like or an IC is mounted thereon.

EXAMPLE 1

Figure 3:
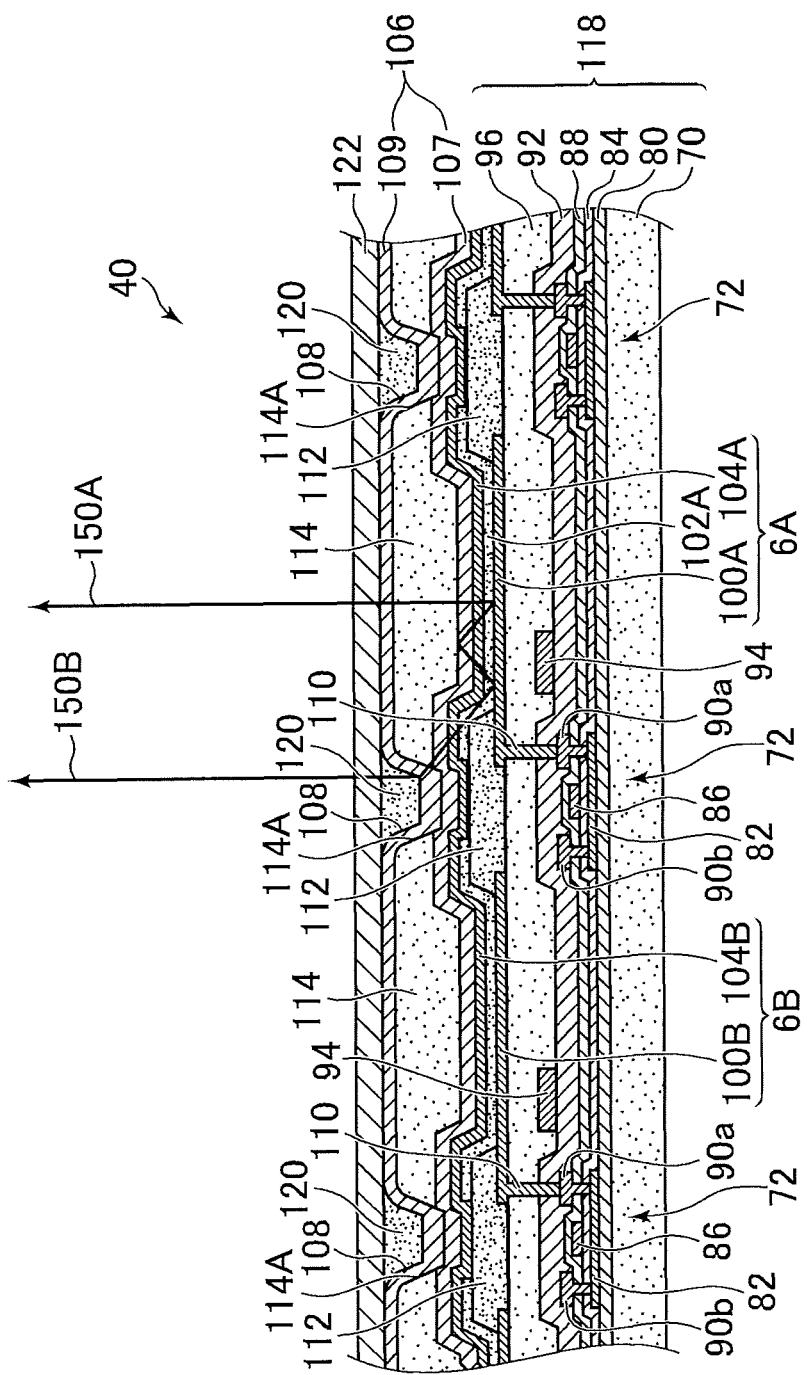
FIG. 3 is a schematic vertical cross-sectional view illustrating example 1 of the display panel at a position along a line III-III illustrated in FIG. 2.

Hereinafter, example 1 in the present embodiment will be described using FIG. 3. FIG. 3 is a schematic vertical cross-sectional view of the display panel 40 at a position along a line III-III illustrated in FIG. 2. The display panel 40 has a structure in which a circuit layer configured of a TFT 72 and the like on an insulating base material 70 made of the resin film or the like, a plurality of organic light-emitting diodes 6 including a first organic light-emitting diode 6A, a second organic light-emitting diode 6B, and the like, and the first inorganic insulating layer 107, the second inorganic insulating layer 109, and the like as a sealing layer that seals the organic light-emitting diodes 6 are stacked. For example, the glass and a flexible material such as a polyimide film can be used as the insulating base material 70. A filling layer 114 can be formed between the first inorganic insulating layer 107 and the second inorganic insulating layer 109. A first recessed portion 108 is formed on the upper surface of the second inorganic insulating layer 109, and a second refractive index layer 120 is formed inside the first recessed portion 108. The second refractive index layer 120 has a refractive index lower than the first inorganic insulating layer 107 and the second inorganic insulating layer 109. Further, a counter substrate 122 is provided on the upper surface of the second inorganic insulating layer 109 in the embodiment. The counter substrate 122 can use, for example, a transparent base material such as the resin film and a glass substrate. The counter substrate 122 may further have a configuration in which a color filter is stacked or a circular polarization plate is stacked.

In the present embodiment, the organic light-emitting diode 6 emits light radiated in all directions in an organic layer 102. Light emitted toward an insulating base material 70 side of the light radiated from the organic layer 102 is reflected toward a counter substrate 122 side by a lower electrode 100 disposed below the organic layer 102. In the embodiment, a configuration in which each organic light-emitting diode 6 respectively emits light of red, green, and blue will be described, but each organic light-emitting diode 6 may also emit light of a color other than the above. The configuration may not be limited to the three colors and may also be configured of four colors, for example, of red, green, blue, and white. Each of organic light-emitting diodes 6 may also emit white light. A configuration in which a color filter corresponding to each pixel is disposed on the counter substrate 122 side may also be employed.

An underlying structure layer 118 includes the circuit layer, and the pixel circuit 8, the scanning signal line 28, the video signal line 30, the driving power supply line 32, and the like described above are formed in the circuit layer. The pixel circuit 8, the scanning signal line 28, the video signal line 30, the driving power supply line 32, and the like are electrically connected to the driver IC 48, FPC 50, and the like disposed in the driving unit formation region 46 illustrated in FIG. 2.

Hereinafter, more specific configuration and a method of manufacturing for realizing the configuration will be described. A polysilicon (p-Si) film is formed on the insulating base material 70 through a first insulating film 80 as an underlying layer made of an inorganic insulating material such as silicon nitride ($SiN_y$) and silicon oxide ($SiO_x$). Then, the p-Si film is patterned to selectively leave a p-Si film at a place used in the TFT 72. For example, a semiconductor region 82 to be a channel portion, a source portion, and a drain portion of the top gate type TFT 72 is formed using the p-Si film. A gate electrode 86 is disposed on the channel portion of the TFT 72 through a gate insulating film 84. The gate electrode 86 is formed by patterning a metal film formed by sputtering or the like.

Then, an interlayer insulating film 88 covering the gate electrode 86 is stacked. An impurity is introduced in the p-Si to be the source portion and the drain portion of the TFT 72 by ion implantation, and a source electrode 90a and a drain electrode 90b electrically connected to the source portion and the drain portion are further formed. In this manner, the TFT 72 is formed and then an interlayer insulating film 92 is stacked. Wiring 94 and the like can be formed on a surface of the interlayer insulating film 92 by patterning a metal film formed by sputtering or the like. For example, the wiring 116 and the scanning signal line 28, the video signal line 30, and the driving power supply line 32 illustrated in FIG. 1 can be formed with a multilayer wiring structure using the metal film and the metal film used for forming the gate electrode 86, the source electrode 90a, and the drain electrode 90b. A planarization film 96 is formed on the patterned metal film, for example, by stacking an organic material such as an acrylic resin.

In the present example, the layers from the insulating base material 70 to the planarization film 96 are set as the underlying structure layer 118. Another organic material layer or inorganic material layer may be provided further on the upper layer of the planarization film 96, and another organic material layer or inorganic material layer may be set as the underlying structure layer 118.

The first organic light-emitting diode 6A and the second organic light-emitting diode 6B are formed on the underlying structure layer 118. The first organic light-emitting diode 6A has a lower electrode 100A, an organic layer 102A, and an upper electrode 104A, and the lower electrode 100A, the organic layer 102A, and the upper electrode 104A are stacked in order from the insulating base material 70 side. In the present embodiment, the lower electrode 100A is the anode of the first organic light-emitting diode 6A, and the upper electrode 104A is the cathode thereof. The organic layer 102A is configured to have a hole transport layer, a light-emitting layer, an electron transport layer, and the like. Similarly, the second organic light-emitting diode 6B has a lower electrode 100B, an organic layer 102B, and an upper electrode 104B, and the lower electrode 100B, the organic layer 102B, and the upper electrode 104B are stacked in order from the insulating base material 70 side. In the embodiment, the lower electrode 100B is the anode of the second organic light-emitting diode 6B, and the upper electrode 104B is the cathode thereof. The organic layer 102B is configured to have the hole transport layer, the light-emitting layer, the electron transport layer, and the like.

If the TFT 72 illustrated in FIG. 3 is the driving TFT 12 having an n channel, each of the lower electrode 100A of the first organic light-emitting diode 6A and the lower electrode 100B of the second organic light-emitting diode 6B is connected to the source electrode 90a of the TFT 72. Specifically, the underlying structure layer 118 described above is formed and then a contact hole 110 is formed for connecting each of the lower electrode 100A and the lower electrode 100B to the TFT 72. Then, the lower electrode 100 connected to the TFT 72 can be formed for each pixel by patterning a conductive film formed on the upper surface of the underlying structure layer 118 and inside the contact hole 110.

After the formation of the lower electrode 100A and the lower electrode 100B, a bank 112 which is an insulating layer covering the end portion of the lower electrode 100A is formed. Photosensitive acrylic or the like is used as a material of the bank 112. The bank 112 may be formed using a resin such as polyimide. An opening region surrounded by the bank 112 is an effective region (light-emitting region) of the organic light-emitting diode in a pixel. The lower electrode 100A and the lower electrode 100B are exposed in the effective region of the pixel.

After the formation of the bank 112, each layer configuring the organic layer 102A is stacked in order on the lower electrode 100A. Similarly, each layer configuring the organic layer 102B is stacked in order on the lower electrode 100B. Each of the organic layers 102A and 102B is formed by vapor deposition and formed also on a part of the upper surface of the bank 112. A portion configuring a part of the first organic light-emitting diode 6A in a formation region of the lower electrode 100A is set as the organic layer 102A, and a portion configuring a part of the second organic light-emitting diode 6B in a formation region of the lower electrode 100B is set as the organic layer 102B. The organic layers 102A and 102B may be stacked by coating formation after solvent dispersion.

In the present example illustrated in FIG. 3, the organic layers 102A and 102B are formed on the part of the upper surface of the bank 112, but the organic layers 102A and 102B may not be formed on the upper surface of the bank 112.

Then, the upper electrode 104A is formed on the organic layer 102A and the upper electrode 104B is formed on the organic layer 102B by vapor deposition. In a case of a top emission structure, the upper electrodes 104A and 104B are formed using a transparent electrode material. There are ITO, IZO, and the like as the transparent electrode material. In the present example, the upper electrodes 104A and 104B are formed on the upper surface of the organic layer 102A, the organic layer 102B, and the bank 112. That is, the upper electrodes 104A and 104B are formed continuously over substantially the entire surface of the display region 42. In FIG. 3, a portion configuring a part of the first organic light-emitting diode 6A is set as the upper electrode 104A in the formation region of the lower electrode 100A, and a portion configuring a part of the second organic light-emitting diode 6B is set as the upper electrode 104B in the formation region of the lower electrode 100B.

The first inorganic insulating layer 107 is formed on the upper surface of the upper electrodes 104A and 104B. The first inorganic insulating layer 107 is made of an inorganic insulating layer. The first inorganic insulating layer 107 is formed by depositing, for example, silicon nitride, silicon oxide, silicon oxynitride, or the like by a CVD method. As illustrated in FIG. 3, the first inorganic insulating layer 107 is provided from the upper surface of the first organic light-emitting diode 6A and the second organic light-emitting diode 6B to the upper surface of the bank 112. That is, the first inorganic insulating layer 107 is formed continuously over substantially the entire surface of the display region 42.

After the formation of the first inorganic insulating layer 107, the filling layer 114 is stacked on the upper surface of the first inorganic insulating layer 107. The filling layer 114 is formed by a method such as printing or coating using, for example, the organic material such as acrylic resin or epoxy resin.

In the present example, the filling layer 114 is configured to have a second recessed portion 114A in a part of a formation region of the bank 112. In particular, in the present example illustrated in FIG. 3, the second recessed portion 114A is on the upper surface of the first inorganic insulating layer 107, and the filling layer 114 is not formed on the upper surface of the first inorganic insulating layer 107 in a formation region of the second recessed portion 114A.

After the formation of the filling layer 114, the second inorganic insulating layer 109 is formed. The second inorganic insulating layer 109 is made of the inorganic insulating layer. Similarly to the first inorganic insulating layer 107, the second inorganic insulating layer 109 is formed by depositing, for example, silicon nitride, silicon oxide, silicon oxynitride, or the like by the CVD method. The second inorganic insulating layer 109 is formed on the upper surface and the side surface of the filling layer 114, and on the upper surface of the first inorganic insulating layer 107 exposed from the second recessed portion 114A of the filling layer 114. That is, the second inorganic insulating layer 109 is formed continuously over substantially the entire surface of the display region 42. As illustrated in FIG. 3, the second inorganic insulating layer 109 has a shape conforming to an upper surface shape of the filling layer 114 and has the first recessed portion 108 having a shape conforming to a shape of the second recessed portion 114A of the filling layer 114.

As illustrated in FIG. 3, the second refractive index layer 120 is provided inside the first recessed portion 108. The second refractive index layer 120 may be made of any material as long as the material has a refractive index lower than a refractive index of a material used for the first inorganic insulating layer 107 and the second inorganic insulating layer 109, and is made of, for example, the air, nitrogen gas, acrylic resin, or the like. In a case where the material used for the filling layer 114 is the acrylic resin, the second refractive index layer 120 may be made of the same material as the filling layer 114. In the present example, the counter substrate 122 is mounted on the upper surface of the second inorganic insulating layer 109 in a state where the air is filled inside the first recessed portion 108. Accordingly, the air is confined between the first recessed portion 108 and the counter substrate 122, and the air is the material configuring the second refractive index layer 120. In a case where the display panel 40 is manufactured in a nitrogen atmosphere, the second refractive index layer 120 may be made of the nitrogen gas. Alternatively, the second refractive index layer 120 can be formed by filling the inside of the first recessed portion 108 with the same material as the filling layer 114 before forming the counter substrate 122.

According to such configuration, it is possible to improve the extraction efficiency of light output from the organic layer 102A of the first organic light-emitting diode 6A. A reason for this will be described below.

As illustrated in FIG. 3, light 150A, of the light emitted from the organic layer 102A of the first organic light-emitting diode 6A, emitted in a direction perpendicular to alight-emitting surface of the first organic light-emitting diode 6A, that is, perpendicular to a stacking surface of each constituent layer in the first organic light-emitting diode 6A passes through the first inorganic insulating layer 107, the filling layer 114, and the second inorganic insulating layer 109, and is emitted from the upper surface of the counter substrate 122.

However, as illustrated in FIG. 3, light 150B, of the light emitted from the organic layer 102A of the first organic light-emitting diode 6A, emitted in a direction oblique to the light-emitting surface of the first organic light-emitting diode 6A is reflected at an interface between the first inorganic insulating layer 107 and the filling layer 114, further reflected at the lower electrode 100A, and is incident on the first inorganic insulating layer 107 and the second inorganic insulating layer 109 provided on the upper surface of the bank 112.

The light 150B, emitted in the direction oblique to the light-emitting surface of the first organic light-emitting diode 6A, has an inclination also to the upper surface of the second inorganic insulating layer 109. Therefore, the light 150B may be originally reflected at an interface between the counter substrate 122 provided on the upper surface of the second inorganic insulating layer 109 and the second inorganic insulating layer 109. However, in the present example, the first recessed portion 108 is formed on the upper surface of the second inorganic insulating layer 109, and an inclination of an inner side surface of the first recessed portion 108 plays a role in reducing the inclination of the upper surface of the second inorganic insulating layer 109 with respect to an incident direction of the light 150B. That is, the light 150B, emitted in the direction oblique to the light-emitting surface of the first organic light-emitting diode 6A, can be incident at an angle close to perpendicular to the inner side surface of the first recessed portion 108 in the second inorganic insulating layer 109. As a result, it is possible to suppress that the light 150B, emitted in the direction oblique to the light-emitting surface of the first organic light-emitting diode 6A, is reflected at an interface between the second refractive index layer 120 provided inside the first recessed portion 108 in the second inorganic insulating layer 109 and the second inorganic insulating layer 109.

Further, the light 150B, emitted in the direction oblique to the light-emitting surface of the first organic light-emitting diode 6A, is refracted at the inner side surface of the first recessed portion 108 and thus can be incident at an angle close to perpendicular to an interface between the second refractive index layer 120 and the counter substrate 122. As a result, it is possible to suppress that the light 150B is reflected at the interface between the second refractive index layer 120 and the counter substrate 122. Accordingly, it is possible to increase a light amount emitted in the front direction and improve the light utilization efficiency.

Figure 4:
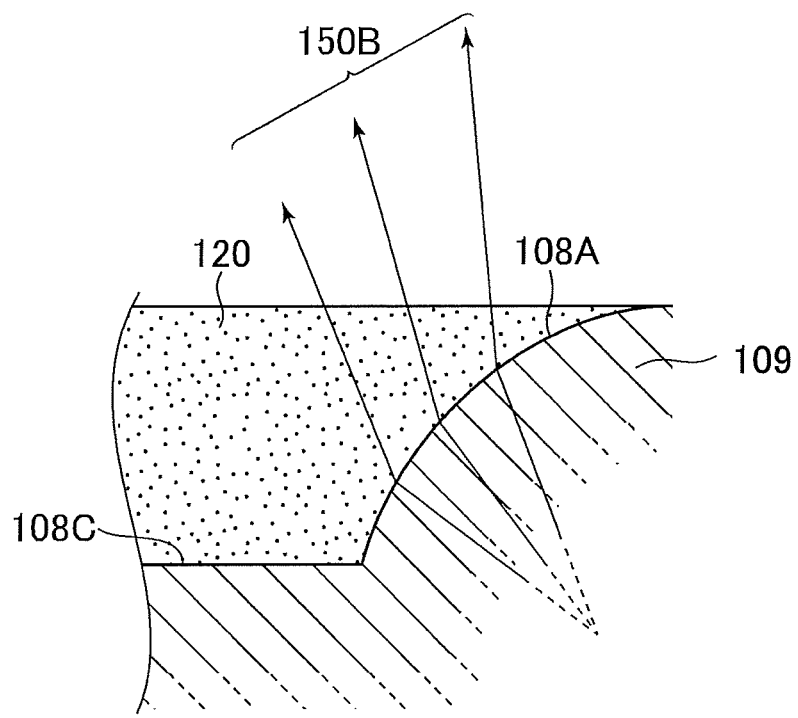
FIG. 4 is a schematic enlarged cross-sectional view of a first recessed portion illustrated in FIG. 3.

It is desirable that the first recessed portion 108 has a configuration including a curved inner side surface. FIG. 4 is an enlarged cross-sectional view of the first recessed portion 108 illustrated in FIG. 3. As illustrated in FIG. 4, the first recessed portion 108 has a shape curved toward an opening side of the first recessed portion 108 as an inner side surface 108A. With such configuration, it is possible to refract each ray of light 150B incident at various angles at the interface between the second inorganic insulating layer 109 and the second refractive index layer 120, and to emit each ray of light 150B toward the opening side of the first recessed portion 108.

As described above, since the shape of the second inorganic insulating layer 109 conforms to the upper surface shape of the filling layer 114, the shape of the first recessed portion 108 depends on the shape of the second recessed portion 114A provided in the filling layer 114. Therefore, in the present embodiment, the shape of the second recessed portion 114A also has a shape having the inner side surface 108A curved toward the opening side of the second recessed portion 114A such that the first recessed portion 108 has the shape having the inner side surface curved toward the opening side of the first recessed portion 108.

Figure 5:
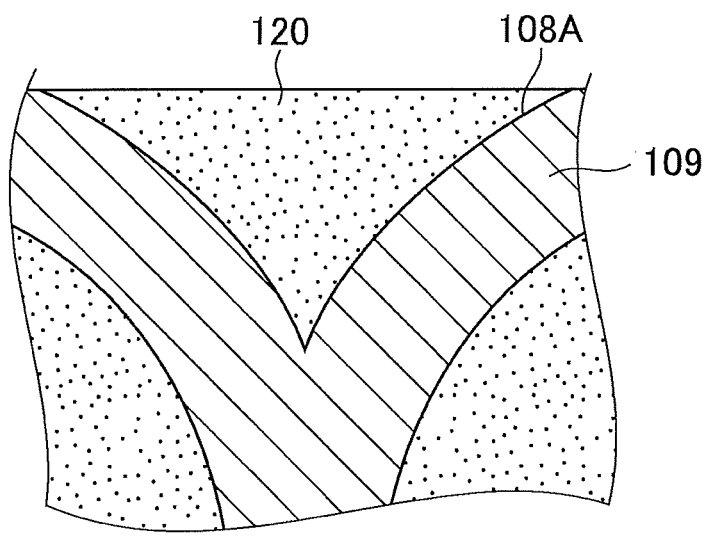
FIG. 5 is a schematic enlarged cross-sectional view of the first recessed portion illustrated in FIG. 3.

In the present example illustrated in FIGS. 3 and 4, the first recessed portion 108 has a bottom portion 108C. However, the first recessed portion 108 may not have a bottom portion 108C as illustrated in FIG. 5 indicating another shape example of the first recessed portion 108. In the example illustrated in FIG. 5, the first recessed portion 108 illustrated in FIG. 3 is configured only by the inner side surface 108A curved toward the opening side of the first recessed portion 108.

In the present example, a first refractive index layer 106 includes the first inorganic insulating layer 107 and the second inorganic insulating layer 109. However, the first refractive index layer 106 may not be a two-layer structure and be configured as one layer of the first refractive index layer 106, and the first recessed portion 108 may be provided on the upper surface side of the first refractive index layer 106. In addition, the first refractive index layer 106 may be configured of a plurality of layers having three or more layers, and the first recessed portion 108 may be provided on the upper surface of any one layer of the plurality of first refractive index layers 106.

Next, a disposition relationship between a light-emitting region 16 and the first recessed portion 108 will be described. Since the first recessed portion 108 can be disposed according to the formation region of the bank 112, it is possible to form the first recessed portion 108 in a substantially lattice shape surrounding the periphery of a first light-emitting region 16A, for example, as illustrated in FIG. 6 which is a schematic plan view indicating the disposition relationship between the light-emitting region 16 and the first recessed portion 108.

The first recessed portion 108 is disposed between the first light-emitting region 16A and a second light-emitting region 16B, and improves the extraction efficiency of the light 150A and the light 150B emitted from the first light-emitting region 16A and light emitted from the second light-emitting region 16B.

Figure 6:
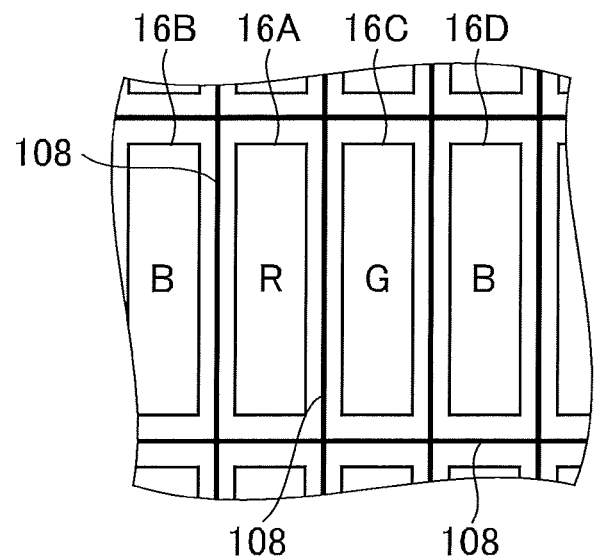
FIG. 6 is a schematic plan view illustrating a disposition relationship between organic light-emitting diodes and the first recessed portions.

As illustrated in FIG. 6, the first recessed portion 108 is disposed not only between the first light-emitting region 16A and the second light-emitting region 16B but also between a plurality of adjacent light-emitting regions 16 in the row direction and the column direction. The first recessed portion 108 is disposed, for example, between the first light-emitting region 16A and a third light-emitting region 16C adjacent in the row direction, and also between the third light-emitting region 16C and a fourth light-emitting region 16D. Therefore, the first recessed portion 108 is formed in the substantially lattice shape surrounding the periphery of the first light-emitting region 16A.

With such configuration, it is possible to obtain the effect of improving the light extraction efficiency described above and to control mixing of light from a pixel in a light-emitting state to a pixel in a non-light-emitting state by controlling an optical path. For example, light emitted in an oblique direction from a light-emitting element is scattered by repeated reflection at an interface having different refractive indices, and thus it is possible to prevent the light from being emitted from another pixel in the non-light-emitting state. In a structure in which a color filter is disposed, it is possible to suppress the mixing of a plurality of light-emitting colors. For example, in the example illustrated in FIG. 6, it is assumed that the light-emitting color of the first organic light-emitting diode 6A is red, and the light-emitting color of the second organic light-emitting diode 6B is blue. In a case where the light 150B emitted from the first organic light-emitting diode 6A in the oblique direction passes through a bank 112 disposition region and is emitted outside the counter substrate 122 in a second organic light-emitting diode 6B disposition region, there is a possibility that the blue light emitted from the second organic light-emitting diode 6B and the red light 150B emitted from the first organic light-emitting diode 6A in the oblique direction are mixed. However, since it is possible to suppress that the light 150B, emitted from the first organic light-emitting diode 6A in the oblique direction, enters the second organic light-emitting diode 6B disposition region due to existence of the first recessed portion 108, it is possible to suppress the mixing of the light-emitting colors. Similarly, since it is possible to suppress that the red light 150B from the first organic light-emitting diode 6A enters a third organic light-emitting diode 6C disposition region that emits green light and a fourth organic light-emitting diode 6D disposition region that emits blue light, it is possible to suppress occurrence of the mixing of the light-emitting colors.

In the example illustrated in FIG. 6, the example in which the light-emitting color of the first light-emitting region 16A is red, the light-emitting color of the second light-emitting region 16B is blue, the light-emitting color of the third light-emitting region 16C is green, and the light-emitting color of the fourth light-emitting region 16D is blue is indicated. However, the light-emitting colors of the first light-emitting region 16A, the second light-emitting region 16B, the third light-emitting region 16C, and the fourth light-emitting region 16D are not limited to the above colors.

Figure 7:
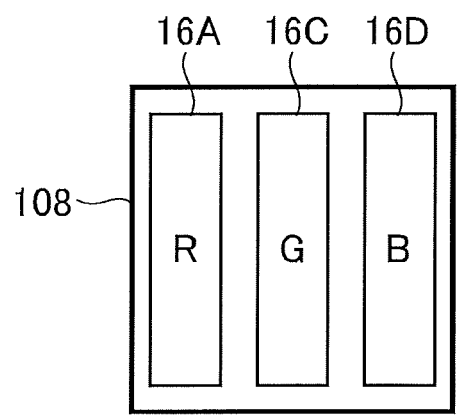
FIG. 7 is a schematic plan view illustrating a disposition relationship between organic light-emitting diodes and the first recessed portion.

As illustrated in FIG. 7, the first light-emitting region 16A where the light-emitting color is red, the third light-emitting region 16C where the light-emitting color is green, and the fourth light-emitting region 16D where the light-emitting color is blue may be set as one set, and the first recessed portion 108 may be formed in a region having a lattice shape surrounding the periphery of the three light-emitting regions 16 that can configure the three primary colors of light. A formation region of the first recessed portion 108 illustrated in FIG. 7 has a substantially lattice shape in which a length of the long side is less than 1.05 times a length of the short side and has a shape close to a square shape. Therefore, since the extraction efficiency of light in the longitudinal direction and the extraction efficiency of light in the lateral direction can be made substantially equal to each other, it is possible to improve visual characteristics.

The example in which the first recessed portion 108 is formed in the region of the substantially rectangular shape so as to surround the periphery of the plurality of light-emitting regions 16 that can configure the three primary colors of light is not limited to the example in which the first light-emitting region 16A, the third light-emitting region 16C, and the fourth light-emitting region 16D having substantially the same rectangular shape are disposed side by side in the lateral direction as illustrated in FIG. 7. For example, as illustrated in FIG. 8, the first light-emitting region 16A and the third light-emitting region 16C having the substantially rectangular shape may be disposed in the longitudinal direction, and the fourth light-emitting region 16D larger than the first light-emitting region 16A and the third light-emitting region 16C may be disposed in the lateral direction of the first light-emitting region 16A and the third light-emitting region 16C.

Figure 9:
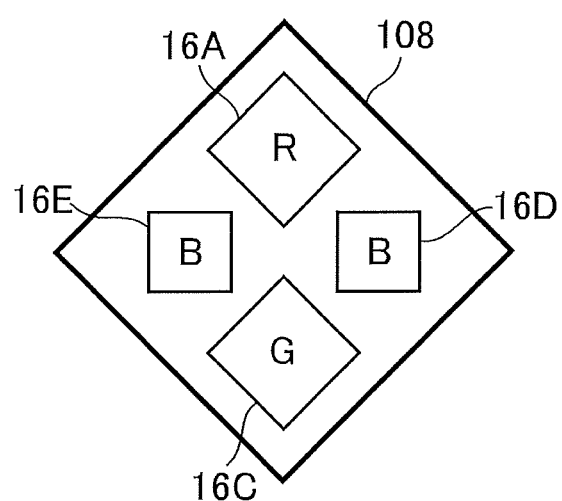
FIG. 9 is a schematic plan view illustrating a disposition relationship between organic light-emitting diodes and the first recessed portion.

As illustrated in FIG. 9, the first light-emitting region 16A where the light-emitting color is red may be disposed near one corner of the formation region of the first recessed portion 108 having the substantially rectangular shape, the third light-emitting region 16C where the light-emitting color is green may be disposed near a diagonal corner of the first light-emitting region 16A, and the fourth light-emitting region 16D and a fifth light-emitting region 16E where the light-emitting color is blue may be disposed near the remaining two corners.

Figure 8:
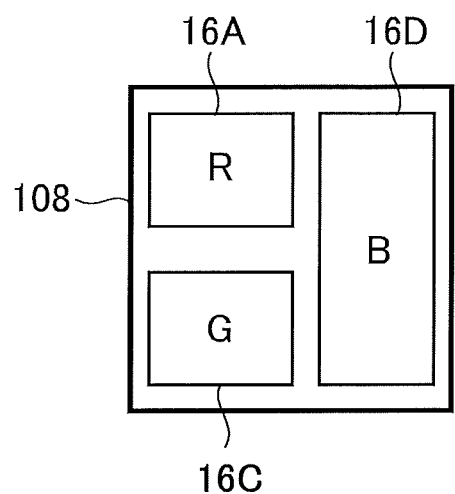
FIG. 8 is a schematic plan view illustrating a disposition relationship between organic light-emitting diodes and the first recessed portion.

The disposition relationships of the light-emitting colors illustrated in FIGS. 7, 8, and 9 are not limited to the above examples and may be any combination as long as a combination of the light-emitting region 16 configuring the plurality of light-emitting colors is established in the region of the substantially rectangular shape surrounded by the first recessed portion 108.

Figure 10:
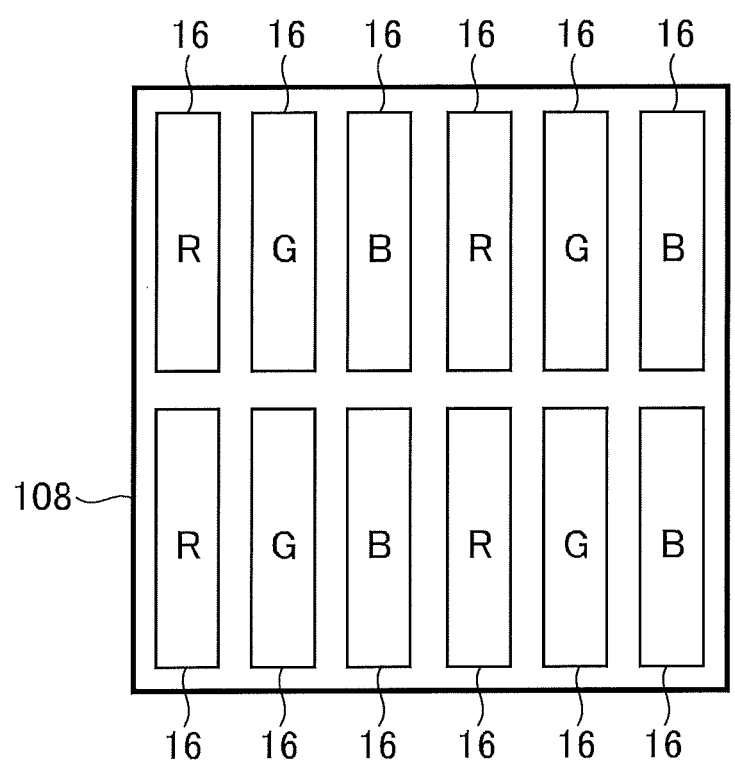
FIG. 10 is a schematic plan view illustrating a disposition relationship between organic light-emitting diodes and the first recessed portion.

As illustrated in FIG. 10, it is possible to ensure the number of light-emitting regions 16 disposed in a limited area by disposing a lot of light-emitting regions 16 configuring the plurality of light-emitting colors in the formation region of the first recessed portion 108 having the substantially rectangular shape. It is possible to improve the light extraction efficiency having a certain level or more also in the configuration illustrated in FIG. 10. When the shape of the formation region of the first recessed portion 108 has a substantially rectangular shape in which a length of the long side is less than 1.05 times a length of the short side and has a shape close to the square shape, since the extraction efficiency of light in the longitudinal direction and the extraction efficiency of light in the lateral direction can be made substantially equal to each other, it is possible to improve the visual characteristics also in the configuration illustrated in FIG. 10.

Figure 11:
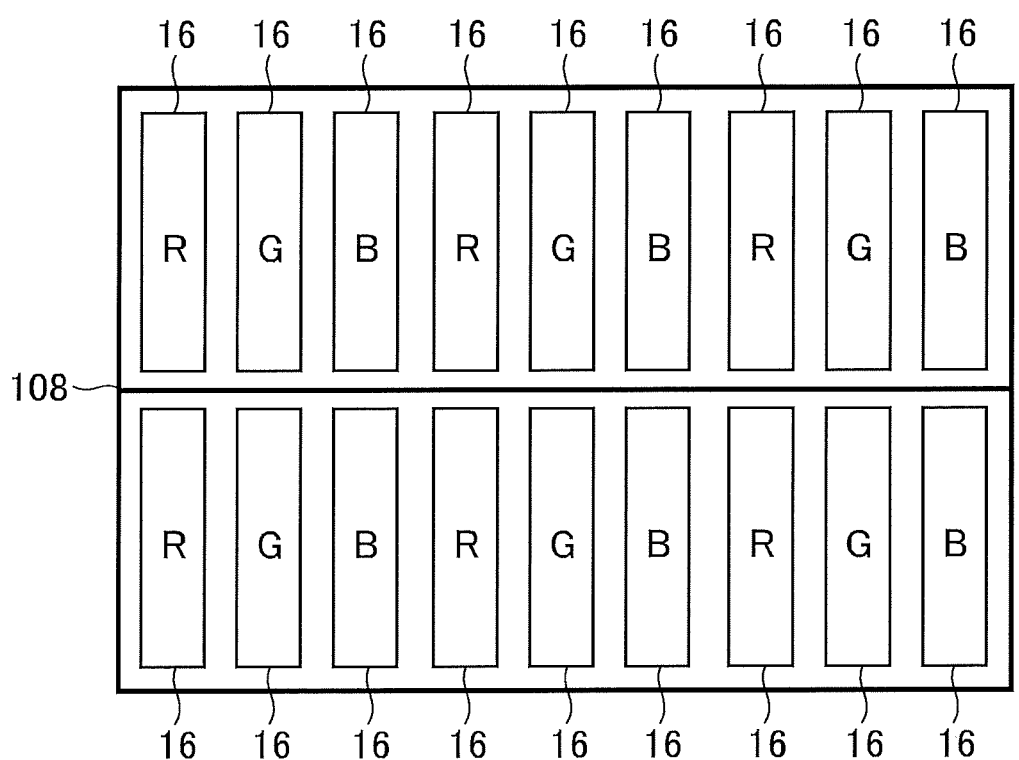
FIG. 11 is a schematic plan view illustrating a disposition relationship between organic light-emitting diodes and the first recessed portion.

As illustrated in FIG. 11, it is possible to impart azimuth angle dependency to the visual characteristics by forming the shape of the formation region of the first recessed portion 108 into a substantially rectangular shape in which a length of the long side is two times or more a length of the short side, and by intentionally making the extraction efficiency of light in the longitudinal direction and the extraction efficiency of light in the lateral direction different from each other. Regarding the effect of imparting the azimuth angle dependency to the visual characteristics, it is possible to obtain the same effect also in the configuration in which the first recessed portion 108 surrounds each light-emitting region 16 having the substantially rectangular shape as illustrated in FIG. 6.

Figure 15:
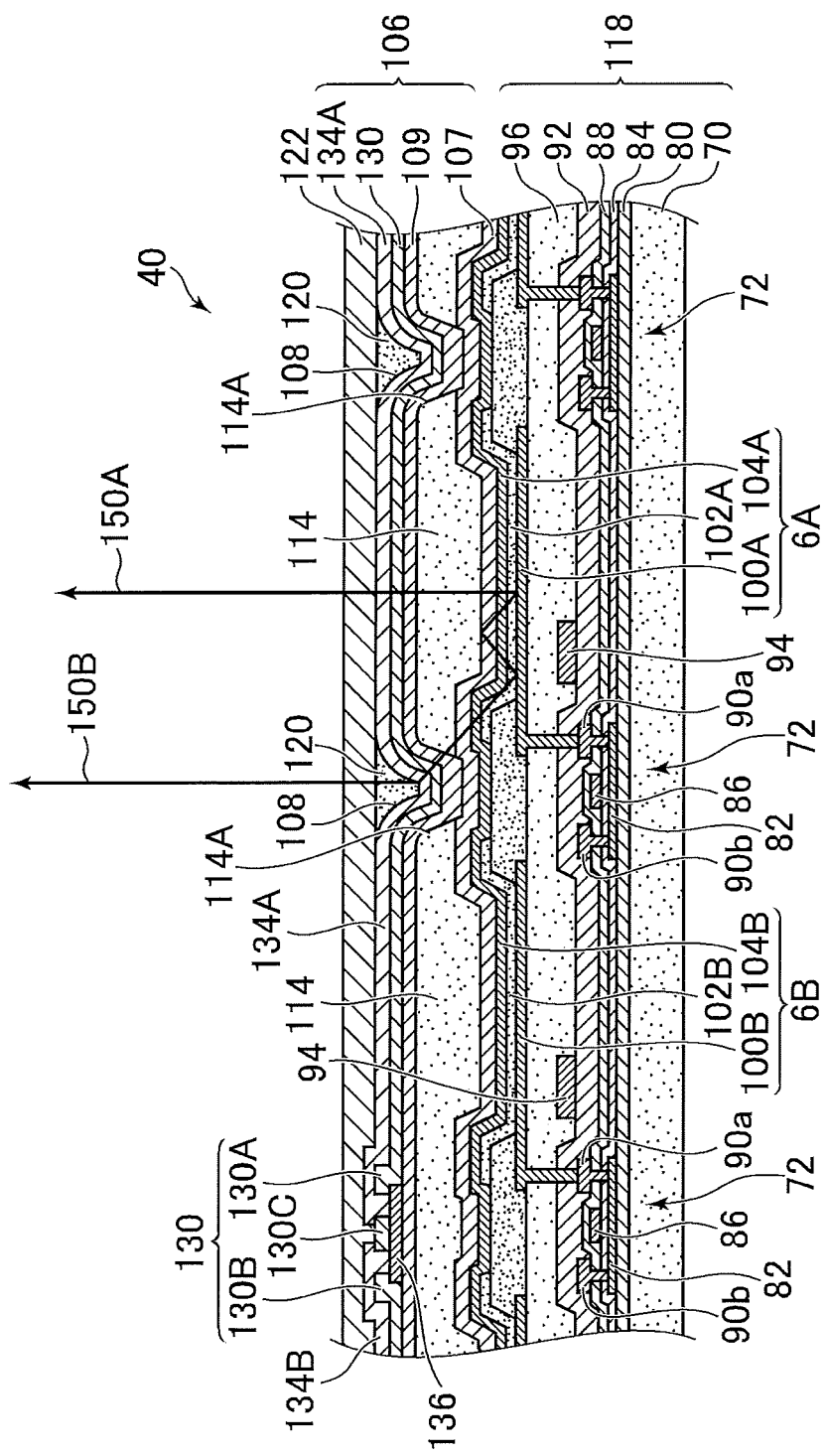
FIG. 15 is a schematic vertical cross-sectional view illustrating Example of a display panel including a touch panel at the position along the line III-III illustrated in FIG. 2.
Figure 16:
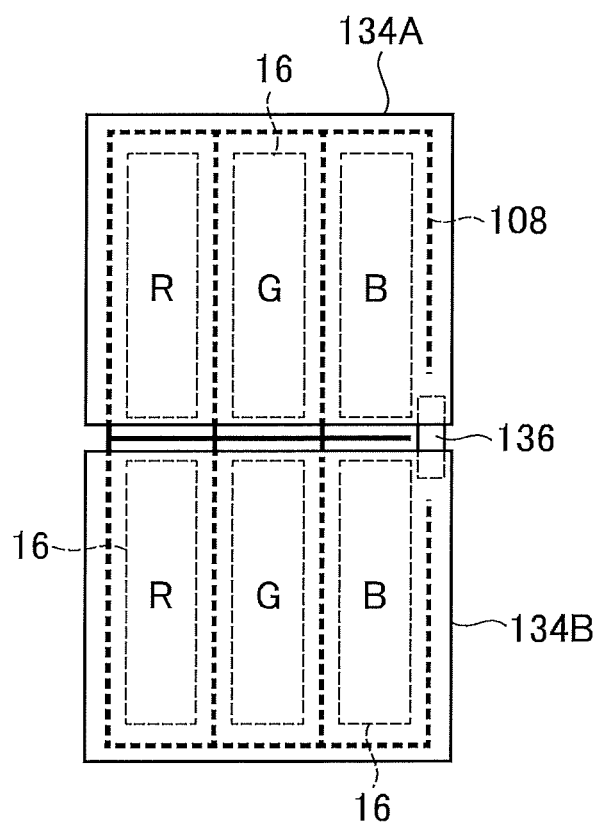
FIG. 16 is a schematic plan view illustrating a disposition relationship between organic light-emitting diodes and the first recessed portion.

As illustrated in FIGS. 15 and 16, a first touch panel electrode 134A and a second touch panel electrode 134B may be provided between the counter substrate 122 and the second inorganic insulating layer 109. Hereinafter, more specific configuration will be described.

First, a jumper 136 is formed on the upper surface of the second inorganic insulating layer 109 before the formation of the counter substrate 122. The jumper 136 connects the first touch panel electrode 134A and the second touch panel electrode 134B. In the present example, the first recessed portion 108 is not provided in a formation region of the jumper 136 in order to ensure a function of the jumper 136.

After the formation of the jumper 136, an inorganic insulating layer 130 is formed on the upper surface of the second inorganic insulating layer 109 and the upper surface of the jumper 136. The inorganic insulating layer 130 is deposited by the CVD method or the like using a material such as silicon nitride ($SiN_y$), silicon oxide ($SiO_x$), or the like.

Since the inorganic insulating layer 130 is formed entirely on the upper surface of the second inorganic insulating layer 109 by the CVD method or the like, a shape of the inorganic insulating layer 130 is a shape conforming to the upper surface of the second inorganic insulating layer 109. As described above, the second inorganic insulating layer 109 has a recessed portion that inherits the shape of the second recessed portion 114A in which the filling layer 114 has on the upper surface thereof. Therefore, the inorganic insulating layer 130 that inherits an upper surface shape of the second inorganic insulating layer 109 also has the recessed portion that inherits the shape of the second recessed portion 114A provided on the upper surface of the filling layer 114.

On the upper surface of the jumper 136, the inorganic insulating layer 130 is not formed entirely and formed separately into the inorganic insulating layer 130A in a formation region of the first touch panel electrode 134A and the inorganic insulating layer 130B in a formation region of the second touch panel electrode 134B, and the inorganic insulating layer 130C is formed between the inorganic insulating layer 130A and the inorganic insulating layer 130B. That is, on the upper surface of the jumper 136, the inorganic insulating layer 130A, the inorganic insulating layer 130B, and the inorganic insulating layer 130C are formed separately at three places.

After the formation of the inorganic insulating layer 130, the first touch panel electrode 134A and the second touch panel electrode 134B are formed. The first touch panel electrode 134A is formed on the upper surface of the inorganic insulating layer 130, and a shape of the first touch panel electrode 134A is a shape conforming to the upper surface of the inorganic insulating layer 130. As described above, the inorganic insulating layer 130 has the recessed portion that inherits the shape of the second recessed portion 114A in which the filling layer 114 has on the upper surface thereof. Therefore, the first touch panel electrode 134A that inherits an upper surface shape of the inorganic insulating layer 130 also has the recessed portion that inherits the shape of the second recessed portion 114A in which the filling layer 114 has on the upper surface thereof, and the recessed portion is the first recessed portion 108. That is, in the present example, the first inorganic insulating layer 107, the second inorganic insulating layer 109, the inorganic insulating layer 130, and the first touch panel electrode 134A are set as the first refractive index layer 106.

In the formation region of the jumper 136, the first touch panel electrode 134A is provided even between the inorganic insulating layer 130A and the inorganic insulating layer 130C, and is connected to the jumper 136 exposed from between the inorganic insulating layer 130A and the inorganic insulating layer 130C. The second touch panel electrode 134B is provided even between the inorganic insulating layer 130B and the inorganic insulating layer 130C, and is connected to the jumper 136 exposed from between the inorganic insulating layer 130B and the inorganic insulating layer 130C.

The counter substrate 122 described above is provided on the upper surface of the inorganic insulating layer 130, and the second refractive index layer 120 made of the air, nitrogen gas, the same material as the filling layer 114, or the like as described above is provided between the counter substrate 122 and the first recessed portion 108. This configuration plays a role in improving the extraction efficiency of the light 150B emitted from the first organic light-emitting diode 6A.

In the present example illustrated in FIG. 15, the first inorganic insulating layer 107, the second inorganic insulating layer 109, the inorganic insulating layer 130, and a touch panel electrode 134 are set as the first refractive index layer 106. However, in a case where the inorganic insulating layer 130 or the touch panel electrode 134 has a refractive index lower than a refractive index of the first inorganic insulating layer 107 or a refractive index of the second inorganic insulating layer 109, the inorganic insulating layer 130 or the touch panel electrode 134 may be set as the second refractive index layer 120, and a recessed portion formed in the second inorganic insulating layer 109 may be defined as the first recessed portion 108.

Alternatively, in a case where an intermediate layer having a refractive index lower than the refractive index of the first inorganic insulating layer 107 or the refractive index of the second inorganic insulating layer 109 is interposed between the first inorganic insulating layer 107, the second inorganic insulating layer 109, the inorganic insulating layer 130, and the touch panel electrode 134, the intermediate layer may be set as the second refractive index layer 120, and a recessed portion provided any one of the first inorganic insulating layer 107, the second inorganic insulating layer 109, the inorganic insulating layer 130, and the touch panel electrode 134 as the first refractive index layer 106 formed on a lower surface side of the second refractive index layer 120 may be defined as the first recessed portion 108.

EXAMPLE 2

Figure 12:
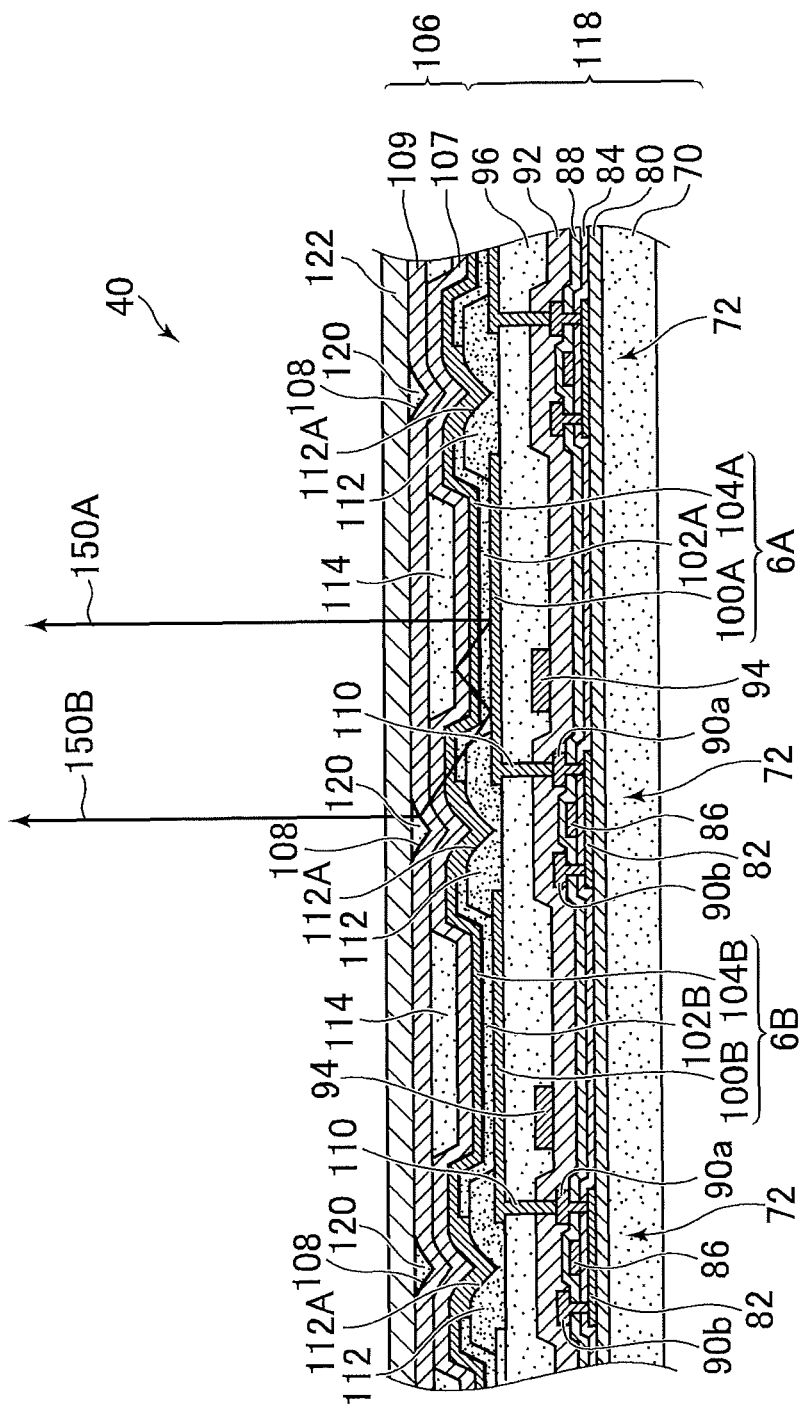
FIG. 12 is a schematic vertical cross-sectional view illustrating example 2 of the display panel at the position along the line III-III illustrated in FIG. 2.

Hereinafter, example 2 in the present embodiment will be described using FIG. 12. The same reference numeral will be assigned to a configuration common to example 1, and a description thereof will be omitted. FIG. 12 is a schematic vertical cross-sectional view of the display panel 40 at the position along line III-III illustrated in FIG. 2.

In the present example, since a configuration of the underlying structure layer 118 is the same as that in example 1, a description thereof will be omitted.

The first organic light-emitting diode 6A and the second organic light-emitting diode 6B are formed on the underlying structure layer 118. The first organic light-emitting diode 6A has the lower electrode 100A, the organic layer 102A, and the upper electrode 104A, and the lower electrode 100A, the organic layer 102A, and the upper electrode 104A are stacked in order from the insulating base material 70 side. In the present embodiment, the lower electrode 100A is the anode of the first organic light-emitting diode 6A, and the upper electrode 104A is the cathode thereof. The organic layer 102A is configured to have the hole transport layer, the light-emitting layer, the electron transport layer, and the like. Similarly, the second organic light-emitting diode 6B has the lower electrode 100B, the organic layer 102B, and the upper electrode 104B, and the lower electrode 100B, the organic layer 102B, and the upper electrode 104B are stacked in order from the insulating base material 70 side. In the present embodiment, the lower electrode 100B is the anode of the second organic light-emitting diode 65, and the upper electrode 104B is the cathode thereof. The organic layer 102B is configured to have the hole transport layer, the light-emitting layer, the electron transport layer, and the like.

After the formation of the lower electrode 100A and the lower electrode 100B, the bank 112 which is the insulating layer covering the end portion of the lower electrode 100A is formed. In the present example, the resin such as polymide and photosensitive acrylic is used as the material of the bank 112. The lower electrode 100A and the lower electrode 100B are exposed in the effective region of the pixel surrounded by the bank 112.

In the present example, as illustrated in FIG. 12, for example, dry etching or wet etching can be selected as a method of forming the third recessed portion 112A for providing the third recessed portion 112A on the upper surface of the bank 112. Here, a shape of the third recessed portion 112A is formed such that an inner side surface of third recessed portion 112A has a shape curved toward an opening side of the third recessed portion 112A.

After the formation of the bank 112, each layer configuring the organic layer 102A is stacked in order on the lower electrode 100A. Similarly, each layer configuring the organic layer 102B is stacked in order on the lower electrode 100B. Each of the organic layers 102A and 102B is formed by vapor deposition and formed also on a part of the upper surface of the bank 112. A portion configuring a part of the first organic light-emitting diode 6A in a formation region of the lower electrode 100A is set as the organic layer 102A, and a portion configuring a part of the second organic light-emitting diode 6B in a formation region of the lower electrode 100B is set as the organic layer 102B. The organic layers 102A and 102B may be stacked by coating formation after solvent dispersion.

Here, the organic layers 102A and 102B are formed on a part of the upper surface of the bank 112 by sputtering or vapor deposition.

In the present example illustrated in FIG. 12, the organic layers 102A and 102B are formed on the part of the upper surface of the bank 112, but the organic layers 102A and 102B may not be formed on the upper surface of the bank 112.

Then, the upper electrode 104A is formed on the organic layer 102A and the upper electrode 104B is formed on the organic layer 102B by vapor deposition. In a case of the top emission structure, the upper electrodes 104A and 104B are formed using a transparent electrode material. There are ITO, IZO, and the like as the transparent electrode material. In the present example, the upper electrodes 104A and 104B are formed on the upper surface of the organic layer 102A, the organic layer 102B, and the bank 112. That is, the upper electrodes 104A and 104B are formed continuously over substantially the entire surface of the display region 42. In FIG. 12, a portion configuring a part of the first organic light-emitting diode 6A in the formation region of the lower electrode 100A is set as the upper electrode 104A, and a portion configuring a part of the second organic light-emitting diode 6B in the formation region of the lower electrode 100B is set as the upper electrode 104B.

Here, since the upper electrodes 104A and 104B are formed on the upper surface of the organic layer 102A, the organic layer 102B, and the bank 112 by vapor deposition, shapes of the upper electrodes 104A and 104B are shapes conforming to the upper surface of the organic layer 102A, the organic layer 102B, and the bank 112. Therefore, the upper electrodes 104A and 104B have recessed portions that inherit the shape of the third recessed portion 112A provided on the upper surface of the bank 112.

The first inorganic insulating layer 107 is formed on the upper surface of the upper electrodes 104A and 104B. The first inorganic insulating layer 107 is the inorganic insulating layer and formed by depositing, for example, silicon nitride, silicon oxide, silicon oxynitride, or the like by the CVD method. As illustrated in FIG. 12, the first inorganic insulating layer 107 is provided from the upper surface of the first organic light-emitting diode 6A and the second organic light-emitting diode 6B to the upper surface of the bank 112. That is, the first inorganic insulating layer 107 is formed continuously over substantially the entire surface of the display region 42.

Here, since the first inorganic insulating layer 107 is formed on the upper surface of the upper electrodes 104A and 104B by the CVD method, a shape of the first inorganic insulating layer 107 has a shape conforming to the upper surface of the upper electrodes 104A and 104B. As described above, the upper electrodes 104A and 104B have the recessed portions that inherit the shape of the third recessed portion 112A in which the bank 112 has on the upper surface thereof. Therefore, the first inorganic insulating layer 107 that inherits an upper surface shape of the upper electrodes 104A and 104B also has the recessed portion that inherits the shape of the third recessed portion 112A provided on the upper surface of the bank 112.

After the formation of the first inorganic insulating layer 107, the filling layer 114 is stacked on the upper surface of the first inorganic insulating layer 107. The filling layer 114 is formed by a method such as printing or coating using, for example, the organic material such as acrylic resin or epoxy resin.

Here, in the present example, the filling layer 114 is formed in a light-emitting region of the first organic light-emitting diode 6A and in a light-emitting region of the second organic light-emitting diode 6B, and is not formed in the formation region of the bank 112. Therefore, the upper surface of the first inorganic insulating layer 107 is exposed from the filling layer 114 in the formation region of the bank 112. Accordingly, the recessed portion of the first inorganic insulating layer 107 that inherits the shape of the third recessed portion 112A described above is in an exposed state.

After the formation of the filling layer 114, the second inorganic insulating layer 109 is formed. Similarly to the first inorganic insulating layer 107, the second inorganic insulating layer 109 is the inorganic insulating layer and formed by depositing, for example, silicon nitride, silicon oxide, silicon oxynitride, or the like by the CVD method. The second inorganic insulating layer 109 is formed on the upper surface of the filling layer 114 and the upper surface of the first inorganic insulating layer 107 exposed from the filling layer 114.

Here, since the second inorganic insulating layer 109 is formed on the upper surface of the first inorganic insulating layer 107 exposed from the filling layer 114 by the CVD method, a shape of the second inorganic insulating layer 109 has a shape conforming to the upper surface of the first inorganic insulating layer 107. As described above, the first inorganic insulating layer 107 has the recessed portion that inherits the shape of the third recessed portion 112A in which the bank 112 has on the upper surface thereof. Therefore, the second inorganic insulating layer 109 that inherits an upper surface shape of the first inorganic insulating layer 107 also has the first recessed portion 108 that inherits the shape of the third recessed portion 112A provided on the upper surface of the bank 112.

As illustrated in FIG. 12, the second refractive index layer 120 is provided inside the first recessed portion 108. The second refractive index layer 120 may be made of any material as long as the material has a refractive index lower than a refractive index of a material used for the first inorganic insulating layer 107 and the second inorganic insulating layer 109, and is made of, for example, the air, nitrogen gas, acrylic resin, or the like. In a case where the material used for the filling layer 114 is the acrylic resin, the second refractive index layer 120 may be made of the same material as the filling layer 114. In the present example, the counter substrate 122 is mounted on the upper surface of the second inorganic insulating layer 109 in a state where the air is filled inside the first recessed portion 108. Accordingly, since the air is confined between the first recessed portion 108 and the counter substrate 122, and the air is the material configuring the second refractive index layer 120. In a case where the display panel 40 is manufactured in a nitrogen atmosphere, the second refractive index layer 120 may be made of the nitrogen gas. In addition, the second refractive index layer 120 can be formed inside the first recessed portion 108 using the same material as the filling layer 114.

According to such configuration, it is possible to improve the extraction efficiency of light output from the organic layer 102A of the first organic light-emitting diode 6A. A reason for this will be described below.

As illustrated in FIG. 12, light 150A, of the light emitted from the organic layer 102A of the first organic light-emitting diode 6A, emitted in a direction perpendicular to alight-emitting surface of the first organic light-emitting diode 6A, that is, perpendicular to a stacking surface of each constituent layer in the first organic light-emitting diode 6A passes through the first inorganic insulating layer 107, the filling layer 114, and the second inorganic insulating layer 109, and is emitted from the upper surface of the counter substrate 122.

However, as illustrated in FIG. 12, light 150B, of the light emitted from the organic layer 102A of the first organic light-emitting diode 6A, emitted in a direction oblique to the light-emitting surface of the first organic light-emitting diode 6A is reflected at an interface between the first inorganic insulating layer 107 and the filling layer 114, further reflected at the lower electrode 100A, and is incident on the first inorganic insulating layer 107 and the second inorganic insulating layer 109 provided on the upper surface of the bank 112.

The light 150B, emitted in the direction oblique to the light-emitting surface of the first organic light-emitting diode 6A, has an inclination also to the upper surface of the second inorganic insulating layer 109. Therefore, the light 150B may be originally reflected at an interface between the counter substrate 122 formed on the upper surface of the second inorganic insulating layer 109 and the second inorganic insulating layer 109. However, in the present example, the first recessed portion 108 is formed on the upper surface of the second inorganic insulating layer 109, and an inclination of an inner side surface of the first recessed portion 108 plays a role in reducing the inclination of the upper surface of the second inorganic insulating layer 109 with respect to an incident direction of the light 150B. That is, the light 150B, emitted in the direction oblique to the light-emitting surface of the first organic light-emitting diode 6A, can be incident at an angle close to perpendicular to the inner side surface of the first recessed portion 108 in the second inorganic insulating layer 109. As a result, it is possible to suppress that the light 150B, emitted in the direction oblique to the light-emitting surface of the first organic light-emitting diode 6A, is reflected at an interface between the second inorganic insulating layer 109 and the second refractive index layer 120.

Further, the light 150B, emitted in the direction oblique to the light-emitting surface of the first organic light-emitting diode 6A, is refracted at the inner side surface of the first recessed portion 108 and thus can be incident at an angle close to perpendicular to an interface between the second refractive index layer 120 and the counter substrate 122. As a result, it is possible to suppress that the light 150B is reflected at the interface between the second refractive index layer 120 and the counter substrate 122. Accordingly, it is possible to increase a light amount emitted in the front direction and improve the light utilization efficiency.

As described also in example 1, the first recessed portion 108 has the inner side surface curved toward an opening side of the first recessed portion 108. With such configuration, it is possible to refract each ray of light 150B incident at various angles at the interface between the second inorganic insulating layer 109 and the second refractive index layer 120, and to emit each ray of light 150B toward the opening side of the first recessed portion 108.

As described above, since the shape of the second inorganic insulating layer 109 conforms to an upper surface shape of the bank 112, the shape of the first recessed portion 108 depends on the shape of the third recessed portion 112A provided on the bank 112.

In the present example, a first refractive index layer 106 includes the first inorganic insulating layer 107 and the second inorganic insulating layer 109. However, the first refractive index layer 106 may be configured as one layer of the first refractive index layer 106, and the first recessed portion 108 may be provided on the upper surface side of the first refractive index layer 106. In the present example, in a case where the first refractive index layer 106 is configured only of the first inorganic insulating layer 107 provided on the upper surface of the upper electrodes 104A and 104B, that is, the first refractive index layer 106 does not include the second inorganic insulating layer 109, the recessed portion of the first inorganic insulating layer 107 may be set as the first recessed portion 108 that inherits the shape of the third recessed portion 112A, and the second refractive index layer 120 may be provided inside the first recessed portion 108.

The first refractive index layer 106 may be configured as a plurality of first refractive index layers 106 having three or more layers, and the first recessed portion 108 may be provided on the upper surface of any one layer of the plurality of first refractive index layers 106.

Since the configuration in which the first touch panel electrode 134A and the second touch panel electrode 134B are provided between the counter substrate 122 and the second inorganic insulating layer 109 is the same as example 1, a description thereof will be omitted. The point that the first recessed portion 108 is not provided in the formation region of the jumper 136 is also the same as example 1, a description thereof will be omitted.

EXAMPLE 3

Figure 13:
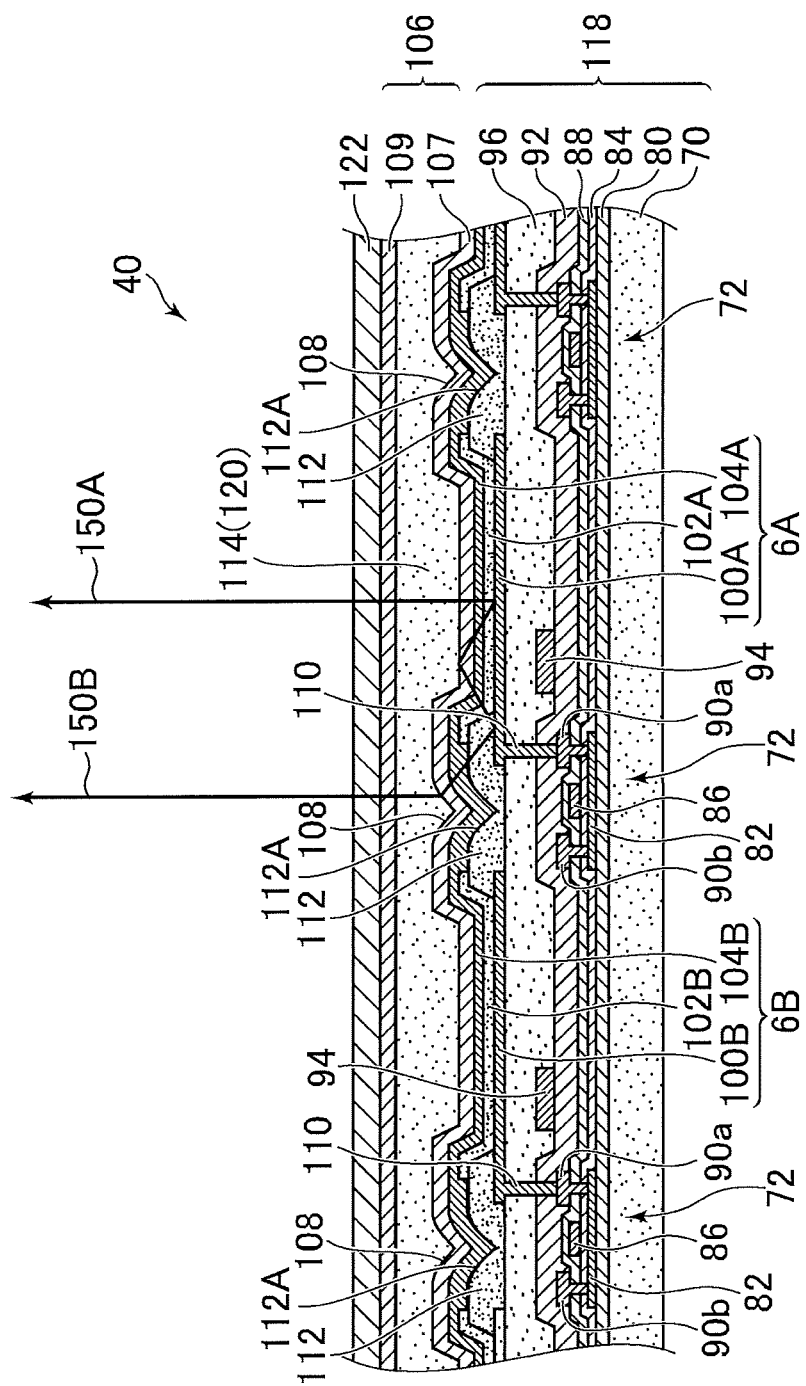
FIG. 13 is a schematic vertical cross-sectional view illustrating example 3 of the display panel at the position along the line III-III illustrated in FIG. 2.

Hereinafter, example 3 in the present embodiment will be described using FIG. 13. The same reference numeral will be assigned to a configuration common to example 1 or example 2, and a description thereof will be omitted. FIG. 13 is a schematic vertical cross-sectional view of the display panel 40 at the position along the line III-III illustrated in FIG. 2.

In the present example, since a configuration of the underlying structure layer 118 is the same as that in examples 1 and 2, a description thereof will be omitted.

The first organic light-emitting diode 6A and the second organic light-emitting diode 6B are formed on the underlying structure layer 118. The first organic light-emitting diode 6A has the lower electrode 100A, the organic layer 102A, and the upper electrode 104A, and the lower electrode 100A, the organic layer 102A, and the upper electrode 104A are stacked in order from the insulating base material 70 side. In the present embodiment, the lower electrode 100A is the anode of the first organic light-emitting diode 6A, and the upper electrode 104A is the cathode thereof. The organic layer 102A is configured to have the hole transport layer, the light-emitting layer, the electron transport layer, and the like. Similarly, the second organic light-emitting diode 6B has the lower electrode 100B, the organic layer 102B, and the upper electrode 104B, and the lower electrode 100B, the organic layer 102B, and the upper electrode 104B are stacked in order from the insulating base material 70 side. In the present embodiment, the lower electrode 100B is the anode of the second organic light-emitting diode 6B, and the upper electrode 104B is the cathode thereof. The organic layer 102B is configured to have the hole transport layer, the light-emitting layer, the electron transport layer, and the like.

After the formation of the lower electrode 100A and the lower electrode 100B, the bank 112 which is the insulating layer covering the end portion of the lower electrode 100A is formed. The photosensitive acrylic or the like is used as the material of the bank 112. The bank 112 may be formed using the resin such as polyimide. An opening region surrounded by the bank 112 is an effective region (light-emitting region) of the organic light-emitting diode in a pixel. The lower electrode 100A and the lower electrode 100B are exposed in the effective region of the pixel.

In the present example, as illustrated in FIG. 13, for example, dry etching or wet etching can be selected as a method of forming the third recessed portion 112A for providing the third recessed portion 112A on the upper surface of the bank 112. Here, a shape of the third recessed portion 112A is formed such that an inner side surface of third recessed portion 112A has a shape curved toward an opening side of the third recessed portion 112A.

After the formation of the bank 112, each layer configuring the organic layer 102A is stacked in order on the lower electrode 100A. Similarly, each layer configuring the organic layer 102B is stacked in order on the lower electrode 100B. Each of the organic layers 102A and 102B is formed by vapor deposition and formed also on apart of the upper surface of the bank 112. A portion configuring apart of the first organic light-emitting diode 6A in a formation region of the lower electrode 100A is set as the organic layer 102A, and a portion configuring a part of the second organic light-emitting diode 6B in a formation region of the lower electrode 100B is set as the organic layer 102B. The organic layers 102A and 102B may be stacked by coating formation after solvent dispersion.

Here, the organic layers 102A and 102B are formed on a part of the upper surface of the bank 112 by sputtering or vapor deposition.

In the present example illustrated in FIG. 13, the organic layers 102A and 102B are formed on the part of the upper surface of the bank 112, but the organic layers 102A and 102B may not be formed on the upper surface of the bank 112.

Then, the upper electrode 104A is formed on the organic layer 102A and the upper electrode 104B is formed on the organic layer 102B by vapor deposition. In a case of the top emission structure, the upper electrodes 104A and 104B are formed using a transparent electrode material. There are ITO, IZO, and the like as the transparent electrode material. In the present example, the upper electrodes 104A and 104B are formed on the upper surface of the organic layer 102A, the organic layer 102B, and the bank 112. That is, the upper electrodes 104A and 104B are formed continuously over substantially the entire surface of the display region 42. In FIG. 13, a portion configuring a part of the first organic light-emitting diode 6A in the formation region of the lower electrode 100A is set as the upper electrode 104A, and a portion configuring a part of the second organic light-emitting diode 6B in the formation region of the lower electrode 100B is set as the upper electrode 104B.

Here, since the upper electrodes 104A and 104B are formed on the upper surface of the organic layer 102A, the organic layer 102B, and the bank 112 by vapor deposition, shapes of the upper electrodes 104A and 104B are shapes conforming to the upper surface of the organic layer 102A, the organic layer 102B, and the bank 112. Therefore, the upper electrodes 104A and 104B have recessed portions that inherit the shape of the third recessed portion 112A provided on the upper surface of the bank 112.

The first inorganic insulating layer 107 is formed on the upper surface of the upper electrodes 104A and 104B. The first inorganic insulating layer 107 is the inorganic insulating layer and formed by depositing, for example, silicon nitride, silicon oxide, silicon oxynitride, or the like by the CVD method. In the present example, the first inorganic insulating layer 107 is formed in formation regions of the first organic light-emitting diode 6A and the second organic light-emitting diode 6B, and a formation region of the bank 112. That is, the first inorganic insulating layer 107 is formed continuously over substantially the entire surface of the display region 42.

Here, since the first inorganic insulating layer 107 is formed on the upper surface of the upper electrodes 104A and 104B by the CVD method, a shape of the first inorganic insulating layer 107 has a shape conforming to the upper surface of the upper electrodes 104A and 104B. As described above, the upper electrodes 104A and 104B have the recessed portions that inherit the shape of the third recessed portion 112A in which the bank 112 has on the upper surface thereof. Therefore, the first inorganic insulating layer 107 that inherits an upper surface shape of the upper electrodes 104A and 104B also has the recessed portion that inherits the shape of the third recessed portion 112A provided on the upper surface of the bank 112. In the present example, the recessed portion formed on the upper surface of the first inorganic insulating layer 107 is the first recessed portion 108.

After the formation of the first inorganic insulating layer 107, the filling layer 114 is stacked on the upper surface of the first inorganic insulating layer 107. The filling layer 114 is formed by a method such as printing or coating using, for example, the organic material such as acrylic resin or epoxy resin.

Here, in the present example, the filling layer 114 is formed in a light-emitting region of the first organic light-emitting diode 6A, in a light-emitting region of the second organic light-emitting diode 6B, and in the formation region of the bank 112. Therefore, the filling layer 114 is formed also inside the first recessed portion 108 provided on the upper surface of the first inorganic insulating layer 107. The filling layer 114 formed inside the first recessed portion 108 functions as the second refractive index layer 120. That is, as described above, since the filling layer 114 is made of a material, such as acrylic resin or epoxy resin, having a refractive index lower than that of silicon nitride, silicon oxide, or silicon oxynitride which is a material configuring the first inorganic insulating layer 107, the filling layer 114 functions as the second refractive index layer 120 in the present example.

According to such configuration, it is possible to improve the extraction efficiency of light output from the organic layer 102A of the first organic light-emitting diode 6A. A reason for this will be described below.

First, as illustrated in FIG. 13, light 150A, of the light emitted from the organic layer 102A of the first organic light-emitting diode 6A, emitted in a direction perpendicular to a light-emitting surface of the first organic light-emitting diode 6A, that is, perpendicular to a stacking surface of each constituent layer in the first organic light-emitting diode 6A passes through the first inorganic insulating layer 107, the filling layer 114, and the second inorganic insulating layer 109, and is emitted from the upper surface of the counter substrate 122.

However, as illustrated in FIG. 13, light 150B, of the light emitted from the organic layer 102A of the first organic light-emitting diode 6A, emitted in a direction oblique to the light-emitting surface of the first organic light-emitting diode 6A is reflected at an interface between the first inorganic insulating layer 107 and the filling layer 114, further reflected at the lower electrode 100A, and is incident on the first inorganic insulating layer 107 provided above the bank 112.

The light 150B, emitted in the direction oblique to the light-emitting surface of the first organic light-emitting diode 6A, has an inclination also to the upper surface of the first inorganic insulating layer 107. Therefore, the light 150B may be originally reflected at an interface between the counter substrate 122 formed on the upper surface of the first inorganic insulating layer 107 and the first inorganic insulating layer 107. However, in the present example, the first recessed portion 108 is formed on the upper surface of the first inorganic insulating layer 107, and an inclination of an inner side surface of the first recessed portion 108 plays a role in reducing the inclination of the upper surface of the first inorganic insulating layer 107 with respect to an incident direction of the light 150B. That is, the light 150B, emitted in the direction oblique to the light-emitting surface of the first organic light-emitting diode 6A, can be incident at an angle close to perpendicular to the inner side surface of the first recessed portion 108 in the first inorganic insulating layer 107. As a result, it is possible to suppress that the light 150B, emitted in the direction oblique to the light-emitting surface of the first organic light-emitting diode 6A, is reflected at an interface between the first inorganic insulating layer 107 and the filling layer 114 that functions as the second refractive index layer 120.

Further, the light 150B, emitted in the direction oblique to the light-emitting surface of the first organic light-emitting diode 6A, is refracted at the inner side surface of the first recessed portion 108 and thus can be incident at an angle close to perpendicular to the lower surface of the second inorganic insulating layer 109 formed on the upper surface of the filling layer 114 and the lower surface of the counter substrate 122. As a result, it is possible to suppress that the light 150B is reflected at the interface between the second refractive index layer 120 and the counter substrate 122. Accordingly, it is possible to increase a light amount emitted in the front direction and improve the light utilization efficiency.

As described also in example 1, the first recessed portion 108 has the inner side surface curved toward an opening side of the first recessed portion 108. With such configuration, it is possible to refract each ray of light 150B incident at various angles at the interface between the first inorganic insulating layer 107 and the second refractive index layer 120, and to emit each ray of light 150B toward the opening side of the first recessed portion 108.

As described above, since the shape of the first inorganic insulating layer 107 conforms to an upper surface shape of the bank 112, the shape of the first recessed portion 108 depends on the shape of the third recessed portion 112A provided on the bank 112.

In the present example, as described above, it is possible to obtain the effect of improving the light extraction efficiency of the rays of light 150B emitted from the first organic light-emitting diode 6A and the second organic light-emitting diode 6B in the directions oblique to the light-emitting surfaces of the first organic light-emitting diode 6A and the second organic light-emitting diode 6B by the first inorganic insulating layer 107 and the filling layer 114 that functions as the second refractive index layer 120 provided inside the first recessed portion 108 formed on the upper surface of the first inorganic insulating layer 107. Therefore, the second inorganic insulating layer 109 may not be provided on the upper surface of the filling layer 114.

The first refractive index layer 106 may be configured as a plurality of first refractive index layers 106 having three or more layers, and the first recessed portion 108 may be provided on the upper surface of any one layer of the plurality of first refractive index layers 106.

In the present example, it is also possible to provide the first touch panel electrode 134A and the second touch panel electrode 134B between the counter substrate 122 and the second inorganic insulating layer 109.

Further, in the present example, the first recessed portion 108 is provided on the first inorganic insulating layer 107, and it is unnecessary to provide the first recessed portion 108 on the second inorganic insulating layer 109. Therefore, in a case where the first touch panel electrode 134A and the second touch panel electrode 134B are provided above the filling layer 114, it is possible to select the formation region of the first recessed portion 108 regardless of the formation region of the jumper 136.

EXAMPLE 4

Figure 14:
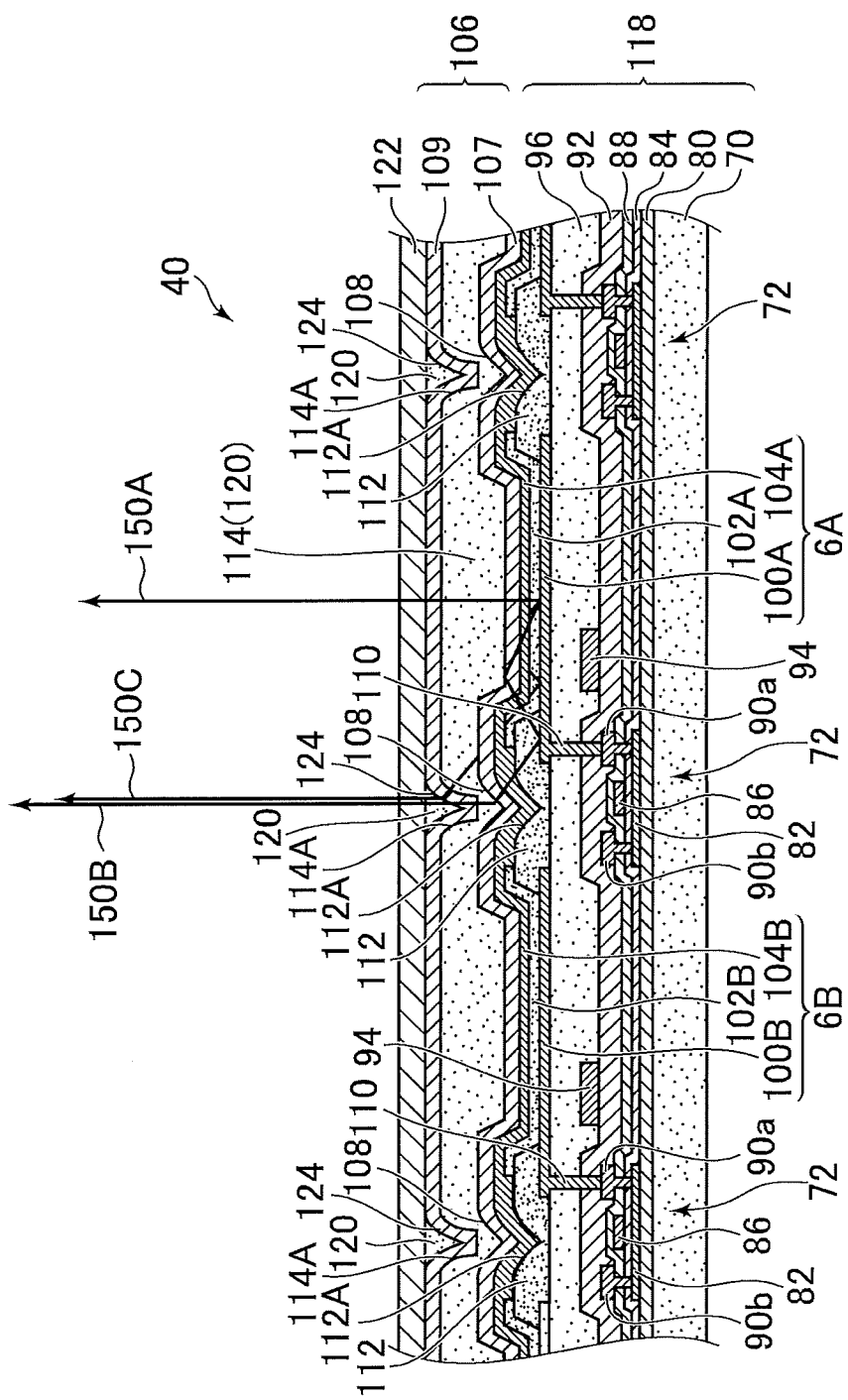
FIG. 14 is a schematic vertical cross-sectional view illustrating example 4 of the display panel at the position along the line III-III illustrated in FIG. 2.

Hereinafter, example 4 in the present embodiment will be described using FIG. 14. The same reference numeral will be assigned to a configuration common to example 1, example 2, or example 3 and a description thereof will be omitted. FIG. 14 is a schematic vertical cross-sectional view of the display panel 40 at the position along the line III-III illustrated in FIG. 2.

In the present example, since a configuration of the underlying structure layer 118 is the same as that in examples 1, 2, and 3, a description thereof will be omitted.

In the present example, since configurations of the bank 112, the first organic light-emitting diode 6A, the second organic light-emitting diode 6B, and the first inorganic insulating layer 107 are the same as the configurations in example 3, a description of the configurations will be omitted. That is, in the present example, the configurations common to example 3 are also employed in that a recessed portion formed on the upper surface of the first inorganic insulating layer 107 is the first recessed portion 108, and the filling layer 114 formed inside the first recessed portion 108 functions as the second refractive index layer 120.

Here, in the present example, the second recessed portion 114A is provided on the upper surface of the filling layer 114 above the first recessed portion 108 in a formation region of the bank 112. That is, the filling layer 114 that functions as the second refractive index layer 120 is formed inside the first recessed portion 108, and the second recessed portion 114A is provided above the filling layer 114.

After the formation of the filling layer 114, the second inorganic insulating layer 109 is formed. The second inorganic insulating layer 109 is formed by depositing, for example, silicon nitride, silicon oxide, silicon oxynitride, or the like by the CVD method. The second inorganic insulating layer 109 is formed on the upper surface of the filling layer 114. As illustrated in FIG. 14, the second inorganic insulating layer 109 has a shape conforming to an upper surface shape of the filling layer 114 and has a fourth recessed portion 124 having a shape conforming to a shape of the second recessed portion 114A provided on the upper surface of the filling layer 114.

As illustrated in FIG. 14, the second refractive index layer 120 is provided inside the fourth recessed portion 124. That is, in the present example, the second refractive index layer 120 is provided inside the first recessed portion 108 provided on the upper surface of the first inorganic insulating layer 107 and the inside of the fourth recessed portion 124 provided on the upper surface of the second inorganic insulating layer 109. The second refractive index layer 120 is made of a material having a refractive index lower than a refractive index of a material used for the first inorganic insulating layer 107 and the second inorganic insulating layer 109, and is made of, for example, the air, nitrogen gas, or the same material as the filling layer 114.

In the present example, the counter substrate 122 is mounted on the upper surface of the second inorganic insulating layer 109 in a state where the air is filled inside the first recessed portion 108. Accordingly, since the air is confined between the first recessed portion 108 and the counter substrate 122, and the air is the material configuring the second refractive index layer 120. In a case where the display panel 40 is manufactured in a nitrogen atmosphere, the second refractive index layer 120 may be made of the nitrogen gas. In addition, the second refractive index layer 120 can be formed inside the first recessed portion 108 using the same material as the filling layer 114.

According to such configuration, it is possible to improve the extraction efficiency of light output from the organic layer 102A of the first organic light-emitting diode 6A. A reason for this will be described below.

First, as illustrated in FIG. 14, light 150A, of the light emitted from the organic layer 102A of the first organic light-emitting diode 6A, emitted in a direction perpendicular to a light-emitting surface of the first organic light-emitting diode 6A, that is, perpendicular to a stacking surface of each constituent layer in the first organic light-emitting diode 6A passes through the first inorganic insulating layer 107, the filling layer 114, and the second inorganic insulating layer 109, and is emitted from the upper surface of the counter substrate 122.

However, as illustrated in FIG. 14, light 150B, of the light emitted from the organic layer 102A of the first organic light-emitting diode 6A, emitted in a direction oblique to the light-emitting surface of the first organic light-emitting diode 6A is reflected at an interface between the first inorganic insulating layer 107 and the filling layer 114, further reflected at the lower electrode 100A, and is incident on the first inorganic insulating layer 107 provided above the bank 112.

The light 150B, emitted in the direction oblique to the light-emitting surface of the first organic light-emitting diode 6A, has an inclination also to the upper surface of the first inorganic insulating layer 107. Therefore, the light 150B may be originally reflected at an interface between the filling layer 114 provided on the upper surface of the first inorganic insulating layer 107 and the first inorganic insulating layer 107. However, in the present example, the first recessed portion 108 is formed on the upper surface of the first inorganic insulating layer 107, and an inclination of an inner side surface of the first recessed portion 108 plays a role in reducing the inclination of the upper surface of the first inorganic insulating layer 107 with respect to an incident direction of the light 150B. That is, the light 150B, emitted in the direction oblique to the light-emitting surface of the first organic light-emitting diode 6A, can be incident at an angle close to perpendicular to the inner side surface of the first recessed portion 108 in the first inorganic insulating layer 107. As a result, it is possible to suppress that the light 150B, emitted in the direction oblique to the light-emitting surface of the first organic light-emitting diode 6A, is reflected at an interface between the first inorganic insulating layer 107 and the filling layer 114 that functions as the second refractive index layer 120.

Further, the light 150B, emitted in the direction oblique to the light-emitting surface of the first organic light-emitting diode 6A, is refracted at the inner side surface of the first recessed portion 108 and thus can be incident at an angle close to perpendicular to the lower surface of the second inorganic insulating layer 109 formed on the upper surface of the filling layer 114 and the lower surface of the counter substrate 122. As a result, it is possible to suppress that the light 150B is reflected at the interface between the second refractive index layer 120 and the counter substrate 122. Accordingly, it is possible to increase a light amount emitted in the front direction and improve the light utilization efficiency.

As described also in example 1, the first recessed portion 108 has the inner side surface curved toward an opening side of the first recessed portion 108. With such configuration, it is possible to refract each ray of light 150B incident at various angles at the interface between the first inorganic insulating layer 107 and the filling layer 114 as the second refractive index layer 120, and to emit each ray of light 150B toward the opening side of the first recessed portion 108.

As described above, since the shape of the first inorganic insulating layer 107 conforms to the upper surface shape of the bank 112, the shape of the first recessed portion 108 depends on the shape of the third recessed portion 112A provided on the bank 112.

Further, in the present example, it is possible to improve the extraction efficiency of light 150C incident obliquely to the second inorganic insulating layer 109 of light emitted in the direction oblique to a light-emitting surface of the first organic light-emitting diode 6A.

The light 150C, incident obliquely to the second inorganic insulating layer 109, has an inclination also to the upper surface of the second inorganic insulating layer 109. Therefore, the light 150C is originally reflected at an interface between the counter substrate 122 provided on the upper surface of the second inorganic insulating layer 109 and the second inorganic insulating layer 109. However, in the present example, the fourth recessed portion 124 is formed on the upper surface of the second inorganic insulating layer 109, and an inclination of an inner side surface of the fourth recessed portion 124 plays a role in reducing the inclination of the upper surface of the second inorganic insulating layer 109 with respect to an incident direction of the light 150C. That is, the light 150C, incident obliquely to the second inorganic insulating layer 109, can be incident at an angle close to perpendicular to the inner side surface of the first recessed portion 108 in the second inorganic insulating layer 109. As a result, it is possible to suppress that the light 150C, incident obliquely to the second inorganic insulating layer 109, is reflected at an interface between the second inorganic insulating layer 109 and the second refractive index layer 120.

Further, the light 150C, incident obliquely to the second inorganic insulating layer 109, is refracted at the inner side surface of the fourth recessed portion 124 and thus can be incident at an angle close to perpendicular to an interface between the second refractive index layer 120 formed inside the fourth recessed portion 124 and the counter substrate 122. As a result, it is possible to suppress that the light 150C is reflected at the interface between the second refractive index layer 120 formed inside the fourth recessed portion 124 and the counter substrate 122. Accordingly, it is possible to increase a light amount emitted in the front direction and improve the light utilization efficiency.

The fourth recessed portion 124 includes the inner side surface curved toward an opening side of the fourth recessed portion 124. With such configuration, it is possible to refract each ray of light 150C incident at various angles at the interface between the second inorganic insulating layer 109 and the second refractive index layer 120, and to emit each ray of light 150C toward the opening side of the fourth recessed portion 124.

As described above, since the shape of the second inorganic insulating layer 109 conforms to an upper surface shape of the filling layer 114, the shape of the fourth recessed portion 124 depends on the shape of the second recessed portion 114A provided on the filling layer 114.

In the present example, it is also possible to provide the first touch panel electrode 134A and the second touch panel electrode 134B between the counter substrate 122 and the second inorganic insulating layer 109.

In the present example, the fourth recessed portion 124 is provided also on the upper surface of the second inorganic insulating layer 109. As described in example 1, it is desirable that the fourth recessed portion 124 is not formed in a formation region of the jumper 136 in order to ensure the function of the jumper 136.

However, in the present example, the first recessed portion 108 is provided on the upper surface of the first inorganic insulating layer 107, and it is possible to select a formation region of the first recessed portion 108 regardless of the formation region of the jumper 136. Therefore, this example can realize the improvement of the light extraction efficiency of the light 150C emitted from the first organic light-emitting diode 6A without depending on the formation region of the jumper 136.

Within the scope of the idea of the present invention, those skilled in the art can conceive various change examples and modification examples, and it is understood that the change examples and modification examples also fall within the scope of the present invention. For example, addition, deletion, or design modification of the constituent element, or addition, omission, or condition change of the step to each embodiment described above as appropriate performed by those skilled in the art also included within the scope of the present invention as long as the gist of the present invention is included.

What is claimed is:

1. A display device comprising:
    a substrate;
    an organic light-emitting diode that includes a first electrode, a first organic layer provided on the first electrode, and a second electrode provided on the first organic layer, which are provided for each pixel on the substrate;
    an insulating layer that is formed along a boundary of the pixel and has an opening portion in a light-emitting region of the pixel so as to expose the first organic layer;
    a first refractive index layer; and
    a second refractive index layer,
    wherein the first refractive index layer is on the insulating layer and the organic light-emitting diode, is made of a material having a first refractive index, and has a first recessed portion overlapping with the insulating layer in plan view, and
    wherein the second refractive index layer is inside the first recessed portion without overlapping with the opening portion and is made of a material having a second refractive index lower than the first refractive index.

2. The display device according to claim 1,
    wherein the first refractive index layer includes a first inorganic insulating layer and a second inorganic insulating layer provided above the first inorganic insulating layer, and
    wherein a second organic layer is provided between the first inorganic insulating layer and the second inorganic insulating layer in the light-emitting region.

3. The display device according to claim 2,
    wherein the second organic layer has a second recessed portion overlapping with the insulating layer, and
    wherein the second inorganic insulating layer is provided along an upper surface shape of the second organic layer and has the first recessed portion having a shape conforming to the second recessed portion, and the first inorganic insulating layer and the second inorganic insulating layer are in contact with each other at the second recessed portion.

4. The display device according to claim 1,
    wherein the insulating layer has a third recessed portion on the upper surface of the insulating layer,
    wherein the first refractive index layer has a shape conforming to an upper surface shape of the insulating layer and overlapping with the insulating layer, and
    wherein the first recessed portion overlaps with the third recessed portion in plan view.

5. The display device according to claim 1, wherein the first recessed portion includes an inner side surface curved toward an opening side of the first recessed portion.

6. The display device according to claim 1, wherein the first refractive index layer includes silicon.

7. The display device according to claim 1, wherein the second refract index layer includes any one of the air, nitrogen gas, and an organic material having transparency as a constituent material.

8. The display device according to claim 1, wherein the first recessed portion is provided so as to surround one light-emitting region or a plurality of the light-emitting regions in plan view.

9. The display device according to claim 8,
wherein the first recessed portion is formed in a region having a substantially rectangular shape in plan view, and
wherein, in the substantially rectangular shape, a length of a long side is two times or more a length of a short side.

* * * * *